(12) United States Patent
Sakamoto et al.

(10) Patent No.: US 9,209,189 B2
(45) Date of Patent: Dec. 8, 2015

(54) SEMICONDUCTOR INTEGRATED CIRCUIT DEVICE AND METHOD FOR PRODUCING THE SAME

(71) Applicant: Renesas Electronics Corporation, Kawasaki-shi, Kanagawa (JP)

(72) Inventors: Misato Sakamoto, Kanagawa (JP); Yoshitake Kato, Kanagawa (JP); Youichi Yamamoto, Kanagawa (JP); Hitoshi Kasai, Kanagawa (JP); Satoshi Itou, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/661,734

(22) Filed: Mar. 18, 2015

(65) Prior Publication Data

US 2015/0270271 A1 Sep. 24, 2015

(30) Foreign Application Priority Data

Mar. 19, 2014 (JP) .................. 2014-056185

(51) Int. Cl.
| | | |
|---|---|---|
| *H01L 21/20* | (2006.01) | |
| *H01L 21/31* | (2006.01) | |
| *H01L 27/108* | (2006.01) | |
| *H01L 49/02* | (2006.01) | |
| *H01L 21/285* | (2006.01) | |
| *H01L 21/321* | (2006.01) | |
| *H01L 21/02* | (2006.01) | |

(52) U.S. Cl.
CPC .... *H01L 27/10814* (2013.01); *H01L 21/02181* (2013.01); *H01L 21/02183* (2013.01); *H01L 21/02189* (2013.01); *H01L 21/28556* (2013.01); *H01L 21/28568* (2013.01); *H01L 21/3212* (2013.01); *H01L 27/10852* (2013.01); *H01L 28/60* (2013.01)

(58) Field of Classification Search
CPC ............................... H01L 21/20; H01L 21/31
USPC .......................................................... 257/306
See application file for complete search history.

(56) References Cited

U.S. PATENT DOCUMENTS

| 6,423,992 | B2 * | 7/2002 | Fukuda et al. ................. 257/288 |
| 6,720,232 | B1 * | 4/2004 | Tu et al. ........................ 438/396 |
| 8,212,299 | B2 | 7/2012 | Iizuka et al. |

FOREIGN PATENT DOCUMENTS

JP 2005-243921 9/2005

* cited by examiner

*Primary Examiner* — Marc Armand
(74) *Attorney, Agent, or Firm* — Womble Carlyle Sandridge & Rice PLLC

(57) ABSTRACT

A capacitive element has improved electrical properties. The capacitive element is configured in a DRAM cell and has a lower electrode, a capacitive insulator film formed over the lower electrode, and an upper electrode formed over the capacitive insulator film. The upper electrode has a structure in which from the capacitive insulator film side of this electrode, a first upper electrode, a second upper electrode and a third upper electrode are stacked in turn. The third upper electrode is a tungsten film that may contain an impurity. Between the first and third upper electrodes, the second upper electrode is interposed which is a barrier film for preventing the possible impurity in the third upper electrode from diffusing into the capacitive insulator film.

21 Claims, 14 Drawing Sheets

SEMICONDUCTOR INTEGRATED CIRCUIT DEVICE AND METHOD FOR PRODUCING THE SAME

CROSS-REFERENCE TO RELATED APPLICATIONS

The disclosure of Japanese Patent Application No. 2014-056185 filed on Mar. 19, 2014 including the specification, drawings and abstract is incorporated herein by reference in its entirety.

BACKGROUND

The present invention relates to a semiconductor integrated circuit device, and a method for producing the device, and relates to, for example, a DRAM having a capacitive element (capacitor) of a metal insulator metal (MIM) structure, or an embedded dynamic random access memory (eDRAM) on which a DRAM having a capacitor of an MIM structure, and a logic circuit are consolidated.

For example, a DRAM in an eDRAM has, for example, plural word lines extended in a first direction of a main surface of a semiconductor substrate, plural bit lines extended to a second direction crossing the first direction, and plural DRAM cells coupled electrically to the word lines and the bit lines and each arranged at a site where one of the word lines crosses one of the bit lines.

The DRAM cells each include a single selective metal insulator field effect transistor (MISFET), and a single capacitive element coupled thereto in series. The selective MISFET has a gate electrode formed to be integrated with one of the word lines, and semiconductor regions including a source and a drain, respectively. One of the source and the drain is electrically coupled to one of the bit lines; and the other, to the capacitive element. The capacitive element includes a lower electrode coupled to one of the source and the drain of the selective MISFET, an upper electrode opposed to the lower electrode, and a capacitive insulator film sandwiched between the lower and upper electrodes.

The logic circuit includes a p-channel type MISFET (pMISFET), an n-channel type MISFET (nMISFET), and an interconnection through which the p-channel type MISFET (pMISFET) is electrically coupled to the n-channel type MISFET (nMISFET). The pMISFET has a gate electrode, and a pair of p-type semiconductor regions in which a source and a drain are configured, respectively. The nMISFET has a gate electrode, and a pair of n-type semiconductor regions in which a source and a drain are configured, respectively. The interconnection is made of a conductor film such as an aluminum film or cupper film, and is a multilayered interconnection layer having five, six or more layers. Over the capacitive element, many interconnection layers are laid.

Patent Literatures 1 and 2 listed below each disclose, for example, a capacitive element including a titanium nitride (TiN) film as a lower electrode, a zirconium oxide ($ZrO_2$) film as a capacitive insulator film, and a laminated film of a titanium nitride (TiN) film and a tungsten (W) film as an upper electrode.

CITATION LIST

Patent Literatures

Patent Literature 1: Japanese Unexamined Patent Application Publication (Japanese Patent Application Laid-Open) No. 2002-373945

Patent Literature 2: Japanese Unexamined Patent Application Publication No. 2005-243921

The inventors have investigated, for example, an eDRAM having a capacitive element of an MIM structure including a titanium nitride (TiN) film as a lower electrode, a zirconium oxide ($ZrO_2$) film as a capacitive insulator film, and a laminated film of a titanium nitride (TiN) film and a tungsten (W) film as an upper electrode.

While the shrinkage of eDRAMs has been advanced, a lower electrode, a capacitive insulator film and an upper electrode configured in their capacitive element have been made small in film thickness, whereby a reduction in the area of the capacitive element as viewed in plan has been attained. However, as the capacitive insulator film and the upper electrode have been made smaller in film thickness, a leakage in the capacitive insulator film, that is, a leakage current between the upper electrode and the lower electrode has been increasing to deteriorate the eDRAMs in electric properties. The inventors have come to recognize this problem.

SUMMARY

The inventors' investigations have made the following clear: impurities, such as fluorine (F), contained in a tungsten (W) film or an interlayer dielectric of any eDRAM are caused to diffuse into a capacitive insulator film thereof by a thermal load in, for example, the step of forming the interlayer dielectric after the tungsten (W) film is formed; as a result, a leakage is generated in the capacitive insulator film, so that the capacitive element is deteriorated in electric properties.

Accordingly, techniques for improving the capacitive element in electric properties have been desired.

Other objects and novel features will be made evident from the description of the present specification, and the attached drawings.

According to an aspect, provided is a capacitive element that may be configured in a DRAM cell of an eDRAM, and that has a lower electrode, a capacitive insulator film formed over the lower electrode, and an upper electrode formed over the capacitive insulator film. The upper electrode has a structure in which from the capacitive insulator film side of this electrode, a first upper electrode, a second upper electrode and a third upper electrode are stacked in turn. The third upper electrode includes a tungsten film that may contain an impurity. Between the first and third upper electrodes, the second upper electrode is interposed which is a barrier film preventing the possible impurity contained in the third upper electrode from diffusing into the capacitive insulator film.

According to the present aspect, a capacitive element can be improved in electric properties.

DETAILED DESCRIPTION

Figure 1:
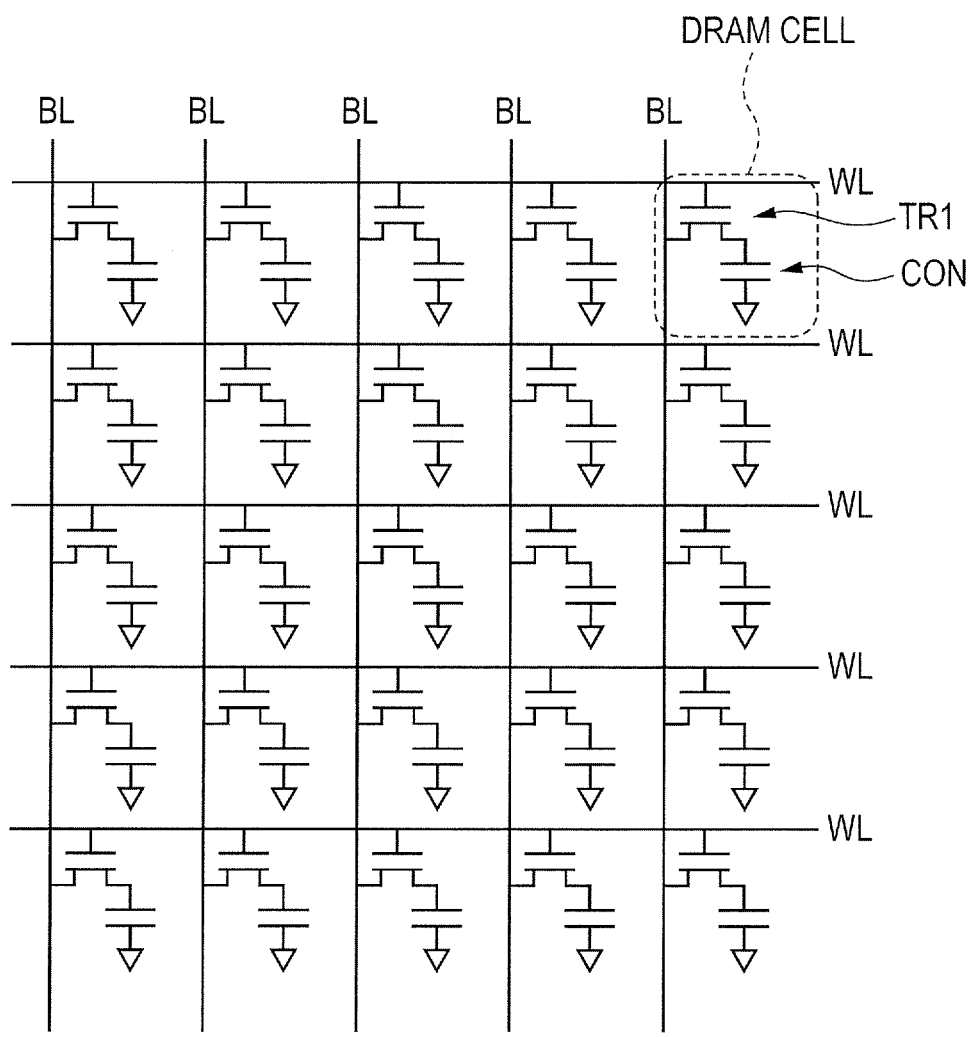
FIG. 1 is an equivalent circuit diagram of a DRAM cell array in a semiconductor integrated circuit device of First embodiment.

Hereinafter, embodiments will be described in detail with reference to the drawings. In all the drawings referred to for describing the embodiments, the same reference sign or number is attached to members having the same function. A repeated description thereon is omitted. Moreover, in the embodiments described hereinafter, any repeated description on the same or similar regions or portions is not in principle made unless especially required.

Even when any one of the drawings referred to for the description on the embodiments is a sectional view, a hatching therein may be omitted to make the drawing easy to view. Even when any one of the drawings is a plan view, a hatching may be applied thereto to make the drawing easy to view.

In the embodiments, the "film density" of any film denotes the volume density of the film, and the numerical value thereof is a value obtained by X-ray reflection (XRR).

First Embodiment

A semiconductor integrated circuit device of each of the present embodiment and an embodiment that will be described later has an eDRAM. Such an eDRAM has a DRAM region DR and a logic circuit region LGC. The DRAM region DR has a DRAM cell array in which DRAM cells are arranged in a matrix form. Each of the DRAM cells is configured to have a single n-channel type selective MISFET, and a single capacitive element coupled in series to this MISFET. Hereinafter, any selective MISFET will be described about one of an n-channel type. However, a p-channel type selective MISFET may be used. In the logic circuit region LGC, plural n-channel type MISFETs and p-channel type MISFETs are arranged. However, in the present embodiment, the n-channel type MISFETs are given as an example, and only this example will be described.

FIG. 1 is a view illustrating an equivalent circuit diagram of a DRAM cell array in a DRAM region DR in the present embodiment. In the DRAM cell array, plural DRAM cells are arranged in a matrix form, and the DRAM cells are each configured to have an n-channel type selective MISFET (TR1), and a capacitive element CON having an MIM structure and coupled in series to this MISFET. The DRAM cell array has plural word lines WL extended to a first second, and plural bit lines BL extended in a second direction orthogonal to the first direction. The DRAM cells are each arranged at a site where one of the word lines WL crosses one of the bit lines BL. The word line WL and the bit line BL are electrically coupled to each other.

Figure 2:
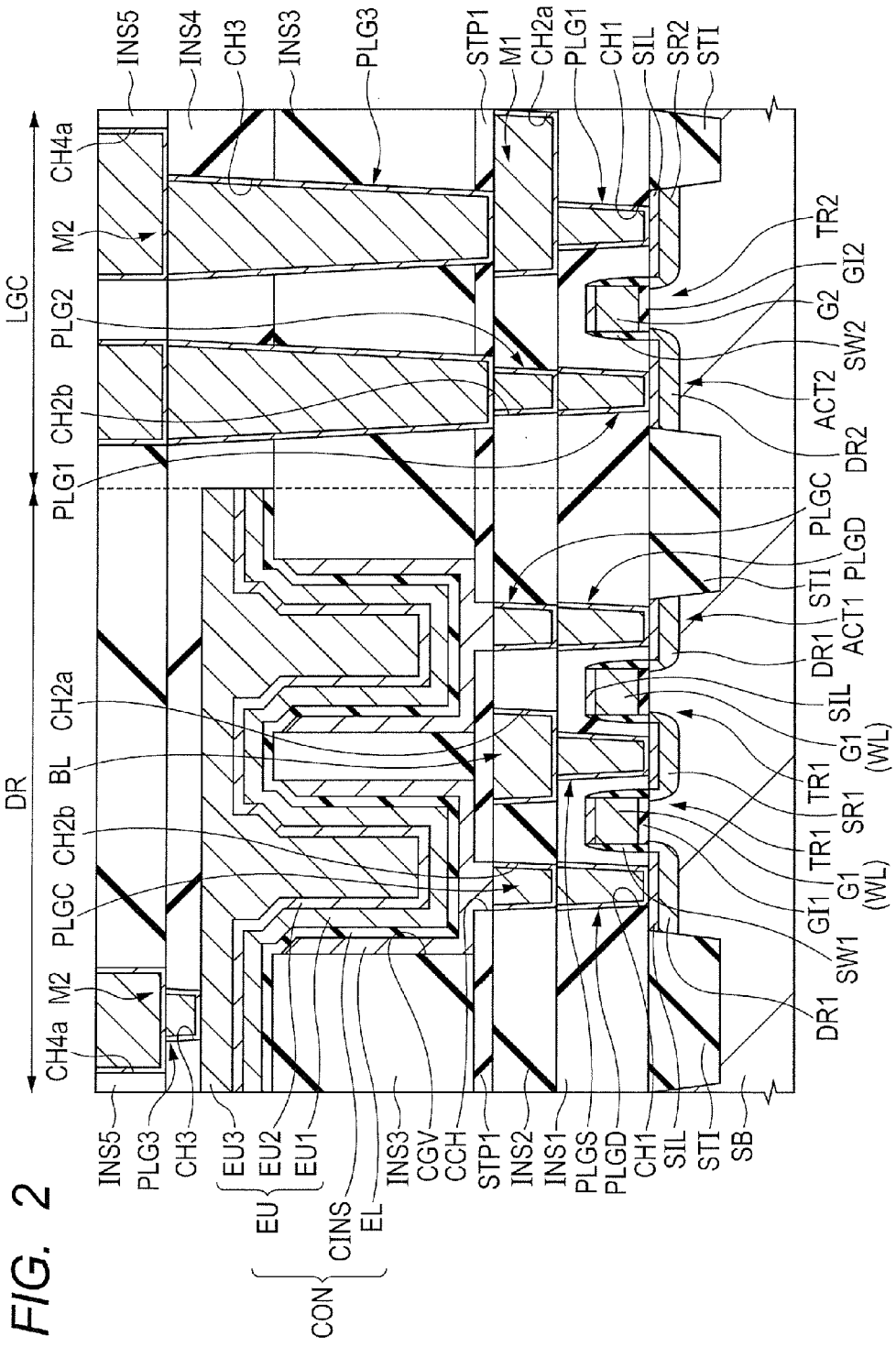
FIG. 2 is a sectional view of a main portion of a DRAM region and a logic circuit region of the semiconductor integrated circuit device of the First embodiment.

FIG. 2 is a sectional view of a main portion of the DRAM region DR and a logic circuit region LGC in the present embodiment. In the DRAM region DR, two of the DRAM cells are illustrated, and in the logic circuit region LGC, one n-channel type logic MISFET (TR2) is illustrated. The logic MISFET (TR2), and selective MISFETs (TR1) configured in the respective DRAM cells are formed in a main surface of a semiconductor substrate SB made of, for example, p-type silicon. The semiconductor substrate SB may be a silicon-on-insulator (SOI) substrate in which a supporting substrate, an insulator film, and a p-type silicon substrate are stacked over each other in this order. The semiconductor substrate SB may be an n-type silicon semiconductor substrate SB, or an SOI substrate in which a supporting substrate, an insulator film, and an n-type silicon substrate are stacked over each other in this order. The semiconductor substrate SB may be a germanium substrate. In the main surface (front surface) of the semiconductor substrate SB, an electrically-insulating element isolation film ST1 is formed to surround a first active region ACT1 and a second active region ACT2. The element isolation film ST1 is, for example, a silicon oxide film.

In the first active region ACT1 in the DRAM region DR, the selective MISFETs (TR1), the number of which is two, are formed. The selective MISFETs (TR1) each have a gate electrode G1, a source region SR1 and a drain region DR1. The gate electrode G1 is formed over the main surface of the semiconductor substrate SB to interpose a gate insulator film GI1 therebetween. The source region SR1 and the drain region DR1 are formed in the main surface of the semiconductor substrate SB and at both side of the gate electrode G1. A side wall film SW1 that is an insulator film is formed on the side wall of the gate electrode G1. A conductive silicide film SIL is formed on the main surface (front surface) of the gate electrode G1 and the respective main surfaces (front surfaces) of the source region SR1 and the drain region DR1.

The logic MISFET (TR2) in the logic circuit region LGC is formed inside the second active region ACT2, and has a gate electrode G2, a source region SR2 and a drain region DR2. The gate electrode G2 is formed over the main surface of the semiconductor substrate SB to interpose a gate insulator film GI2 therebetween. The source region SR2 and the drain region DR2 are formed in the main surface of the semiconductor substrate SB and at both side of the gate electrode G2. A side wall film SW2 that is an insulator film is formed on the side wall of the gate electrode G2. The conductive silicide film SIL is formed on the main surface (front surface) of the gate electrode G2 and the respective main surfaces (front surfaces) of the source region SR2 and the drain region DR2.

The gate electrode G1 and the gate electrode G2 are each made of a polycrystal silicon film (polysilicon film). The source region SR1, the drain region DR1, the source region SR2, and the drain region DR2 are each made of an n-type semiconductor region. The side wall films SW1 and SW2 are each, for example, a silicon oxide film, a silicon nitride film, or a laminated film of a silicon oxide film and a silicon nitride film. The silicide film SIL may be a nickel silicide film, or a platinum-added nickel silicide film (platinum-contained nickel silicide film).

The gate electrode G1 (i.e., each of the gate electrodes G1) and the gate electrode G2 may each be made into a metal gate structure. In this case, the gate electrodes may each have a W/TiN laminated structure, and the gate insulator films GI1 and GI2 may each be a laminated film of SiON or $HfAlO_x$, and $SiO_2$. The metal gate structure may be formed in a known gate-first manner or a gate-last manner. The selective MISFETs (TR1) and the logic MISFET (TR2) may be formed to have an embedded gate structure in which the gate insulator films GI1 and GI2 and the gate electrodes G1 and G2 are embedded in trenches made in the semiconductor substrate SB.

In the DRAM region DR and the logic circuit region LGC, an interlayer dielectric INS1 that is an insulator film is formed on the semiconductor substrate SB to cover the selective MISFETs (TR1) and the logic MISFET (TR2). The interlayer dielectric INS1 covers the respective main surfaces (upper surfaces) of the gate electrodes G1 and the gate electrodes G2. Even when a bit line BL extended in the second direction overlaps with the gate electrodes G1 extended in the first direction when viewed in plan, the bit line BL does not short-circuit the gate electrodes G1. The interlayer dielectric INS1 may be a silicon oxide film or a silicon nitride film, or may have a laminated structure of a silicon oxide film on a silicon nitride film. In the DRAM region DR and the logic circuit region LGC, plural contact holes CH1 are made in the interlayer dielectric INS1 to penetrate the interlayer dielectric INS1. Plural plug electrodes that are each made of a conductor film are formed inside the contact holes CH1, respectively. The plug electrodes each have a laminated structure of the following two: a thin bather conductor film (such as a titanium nitride (TiN) film, a titanium (Ti) film or a laminated film of the two) functioning as a bather metal; and a main conductor film (such as a tungsten film) that is larger in film thickness than the bather conductor film. The plug electrodes penetrate the interlayer dielectric INS1 in the film thickness direction thereof, and the respective upper surfaces of the plug electrodes are exposed to the front surface of the interlayer dielectric INS1. The plug electrodes include a source electrode PLGS connected to the source region SR1 of the selective MISFETs (TR1), drain plug electrodes PLGD connected to the respective drain regions DR1 of the selective MISFETs (TR1), and plug electrodes PLG1 connected to the source region SR2 or the drain region DR2 of the logic MISFETs (TR2).

An interlayer dielectric INS2 that is an insulator film is formed on the interlayer dielectric INS1. The interlayer dielectric INS2 is an silicon oxide film. Plural interconnection trenches CH2a and plural contact holes CH2b are made in the interlayer dielectric INS2. The bit line BL is formed in one of the contact holes CH2a, which is an interconnection trench CH2a in the DRAM region DR. An interconnection M1 is formed in the other, which is an interconnection trench CH2a in the logic circuit region LGC. In some of the contact holes CH2b, which are contact holes CH2b in the DRAM region DR, capacitive plug electrodes PLGC are formed. In the other contact hole CH2b, which is a contact hole CH2b in the logic circuit region LGC, a plug electrode PLG2 is formed. The capacitive plug electrodes PLGC are each stacked on one of the drain plug electrodes PLGD to be electrically coupled, through the drain plug electrode PLGD, to one of the respective drain regions DR1 of the selective MISFETs (TR1). The bit line BL is formed to cover the upper surface of the source plug electrode PLGS to be electrically coupled, through the source plug electrode PLGS, to the source region SR1 of the selective MISFETs (TR1). The plug electrode PLG2 in the logic circuit region LGC is stacked on one of the plug electrodes PLG1 to be electrically coupled, through the plug electrode PLG1, to the drain region DR2 of the logic MISFET (TR2). The interconnection M1 is formed to cover the upper surface of the other plug electrode PLG1 to be electrically coupled, through the plug electrode PLG1, to the source region SR2 of the logic MISFET (TR2).

The capacitive plug electrodes PLGC, the bit line BL, the plug electrode PLG2, and the interconnection M1 are formed to have a laminated structure of the following two: a thin bather conductor film (such as a titanium nitride (TiN) film, a titanium (Ti) film or a laminated film of the two) functioning as a bather metal; and a main conductor film (such as a tungsten film) that is larger in film thickness than the barrier conductor film.

A stopper film STP1 that is an insulator film is formed on the respective upper surfaces of the capacitive plug electrodes PLGC, the plug electrode PLG2, the bit line BL and the interconnection M1. The stopper film STP1 may be a silicon nitride film. In the DRAM region DR, plural capacitive contact holes CCH, which are holes penetrating the stopper film STP1, are made in the stopper Film STP1 to be exposed to the respective upper surfaces of the capacitive plug electrodes PLGC. The capacitive contact holes CCH are each circular when viewed in plan. The diameter thereof is set to not more than the diameter of the upper surface of each of the capacitive plug electrodes PLGC to prevent the capacitive contact hole CCH from overlapping with the bit line BL.

An interlayer dielectric INS3 is formed on the stopper film STP1. The interlayer dielectric INS3 is, for example, an insulator film such as a silicon oxide film. The film thickness thereof is from 550 to 650 nm. In the DRAM region DR, plural capacitor-forming trenches CGV penetrating the interlayer dielectric INS3 are made. The capacitor-forming trenches CGV are each configured by the side wall (side surface) of the interlayer dielectric INS3 and the main surface of the stopper film STP1. Hereinafter, when wordings such as the wordings "the bottom surface of each of the capacitor-forming trenches CGV" and "the side wall (side surface) thereof" are used, the bottom surface denotes the main surface of the stopper film STP1; and the side wall (side surface) thereof, the side wall (side surface) of the interlayer dielectric INS3. The capacitor-forming trenches CGV each have an elliptic shape when viewed in plan. The minor axis thereof is from 180 to 200 nm in length, and the major axis thereof is from 220 to 260 nm in length. The aspect ratio of each of the capacitor-forming trenches CGV (the ratio of the depth of the trench to the minimum width of the opening of the trench) is 3 or more.

Along/on the respective bottom surfaces and side walls of the capacitor-forming trenches CGV, lower electrodes EL of the capacitive elements CON are formed. Each of the lower electrodes EL is electrically coupled to one of the capacitive plug electrodes PLGC. As described above, the bottoms of the capacitor-forming trenches CGV denote the main surface of the stopper film STP1; and the side wall (side surface) thereof, the side wall (side surface) of the interlayer dielectric INS3. For the lower electrode EL, a metal or metal-element-containing material is usable, examples thereof including titanium nitride (TiN), titanium (Ti), tungsten (W), tungsten nitride (WN), platinum, and ruthenium (Ru). The film thickness thereof is from 3 to 40 nm. The lower electrode EL can be formed by a physical vapor deposition (PVD) method, a chemical vapor deposition (CVD) method (in particular, a metal organic chemical vapor deposition (MOCVD) method), or an atomic layer deposition (ALD) method. The length of the minor axis of each of the capacitor-forming trenches CGV, which is elliptic when viewed in plan, is sufficiently larger than twice the film thickness of the lower electrode EL; thus, the capacitor-forming trench CGV is not embedded with any one of the lower electrodes EL. Each of the lower electrodes EL is formed into a small and even thickness along/on the bottom surface and the side wall of one of the capacitor-forming trenches CGV. The lower electrode EL is terminated inside the capacitor-forming trench CGV not to be extended to the upper surface (main surface) of the interlayer dielectric INS3 positioned outside the capacitor-forming trench CGV. About the lower electrode EL, a surface thereof that is near to a capacitive insulator film CINS, which will be described later, is called the upper surface thereof; a surface thereof that is far therefrom, the lower surface.

The above has described an example in which each of the lower electrodes EL directly contacts one of the capacitive plug electrodes PLGC. However, for example, a plug electrode (not illustrated) that is a conductor film, such as a titanium nitride (TiN) film, a titanium (Ti) film or a tungsten (W) film, may be interposed between the lower electrode EL and the capacitive plug electrode PLGC since it is important that the two members EL and PLGC are electrically coupled to each other.

A capacitive insulator film CINS is formed to cover the respective upper surfaces of the lower electrodes EL. An upper electrode EU is formed to cover the upper surface of the capacitive insulator film CINS. About the capacitive insulator film CINS, the surface thereof that is near to the lower electrodes EL is called the lower surface thereof; and the surface thereof that is far therefrom, the upper surface thereof. The capacitive insulator film CINS and the upper electrode EL are formed commonly or singly for plural capacitive elements CON (including the illustrated elements CON). In the DRAM region DR, the capacitive insulator film CINS and the upper electrode EU each formed on the upper surface of the lower electrode EL inside each of the capacitor-forming trenches CGV are extended outside the capacitor-forming trench CGV to cover the upper surface (main surface) of the interlayer dielectric INS3. When viewed in plan, the upper electrode EU is completely superimposed onto the capacitive insulator film CINS so that these members have plane-shapes equal to each other. Each of the lower electrodes EL is formed into a small thickness along/on the bottom surface and the side surface (side wall) of one of the capacitor-forming trenches CGV, and the capacitive insulator film CINS and the upper electrode EU are put into the capacitor-forming trench CGV. In other words, the bottom surface and the side surface of each of the capacitor-forming trenches CGV are used to form the capacitive insulator film CINS and the upper electrode EU along/over the upper surface of each of the lower electrodes EL. Thus, a small flat area is used to form the capacitive elements CON with a high capacitance. The capacitive insulator film CINS may be a zirconium oxide ($ZrO_2$) film, a hafnium oxide ($HfO_2$) film, or a tantalum oxide ($Ta_2O_5$) film. The capacitive insulator film CINS may be a film in which titanium (Ti), aluminum (Al), yttrium (Y) or a lanthanoid is added to a zirconium oxide ($ZrO_2$) film, a hafnium oxide ($HfO_2$) film, or a tantalum oxide ($Ta_2O_5$) film. The capacitive insulator film CINS is formed into a thickness of 4 to 13 nm by an ALD method or a CVD method.

The upper electrode EU has a structure of three metal films, any one of which does not exclude a metal-element-containing film. This structure is a laminated structure in which from the capacitive-insulator-film-CINS-side thereof a first upper electrode EU1, a second upper electrode EU2 and a third upper electrode EU3 are laminated in turn. About each of the first, the second and the third upper electrodes EU1, EU2 and EU3, the surface thereof that is near to the capacitive insulator film CINS is called the lower surface thereof; and the surface thereof that is far therefrom, the upper surface thereof.

The first upper electrode EU1 may be a film including a metal or metal-element-containing material, such as titanium nitride (TiN), titanium (Ti), platinum (Pt), indium (Ir) or ruthenium (Ru). This film can be formed into a thickness of 10 to 50 nm by an MOCVD method or an ALD method. Over the respective bottom surfaces and side surfaces of the capacitor-forming trenches CGV, the first upper electrode EU1 contacts the capacitive insulator film CINS; thus, when the first upper electrode EU1 is formed by an MOCVD method, which less gives a plasma damage onto the capacitive insulator film CINS than an ALD method, a leakage current in the capacitive elements CON can be decreased. When the first upper electrode EU1 is rendered a titanium nitride (TiN) film formed by the MOCVD method, the film density thereof is from 2.5 to 3.5 $g/cm^3$.

The second upper electrode EU2 may be a film including a metal or metal-element-containing material, such as titanium nitride (TiN), titanium (Ti), platinum (Pt), indium (Ir) or ruthenium (Ru). This film can be formed into a thickness of 1.5 to 8 nm by an ALD method, an MOCVD method or a PVD method. The second upper electrode EU2 is formed to cover the front surface of the first upper electrode EU1. Over the respective bottom surfaces and side surfaces of the capacitor-forming trenches CGV, the second upper electrode EU2 contacts the first upper electrode EU1. The second upper electrode EU2 is a bather film for preventing or decreasing the diffusion of an impurity, such as fluorine (F), contained in the third upper electrode EU3, which will be detailed below, into the first upper electrode EU1 and the capacitive insulator film CINS. The second upper electrode EU2 is made thin as far as this electrode attains a function as the bather film. By making the second upper electrode EU2 thinner than, for example, the first upper electrode EU1, the proportion of the film thickness of the third upper electrode EU3 in that of the upper electrode EU can be made high.

The third upper electrode EU3 is a tungsten (W) film formed by a CVD method. The third upper electrode EU3 is formed to decrease the resistance of the upper electrode EU; thus, it is effective that the third upper electrode EU3 is a metal film smaller in electric resistivity than the first and second upper electrodes EU1 and EU2. For reference, the electric resistance of tungsten (W) is 52.8 n$\Omega$·m and that of titanium nitride (TiN) is 217 n$\Omega$·m at room temperature (20° C.). Over the respective bottom surfaces and side surfaces of the capacitor-forming trenches CGV, the third upper electrode EU3 contacts the second upper electrode EU2 to prevent the following: the electric potential of the upper electrode EU at the bottom of the capacitor-forming trenches CGV fluctuates against an electric potential supplied to the upper electrode EU. By forming the third upper electrode EU3 to have a sufficient thickness, the capacitor-forming trenches CGV are completely embedded therewith so that the third upper electrode EU3 has a flat upper surface. In other words, regions of the interlayer dielectric INS3 where the capacitor-forming trenches CGV are made, and other regions thereof have a flat upper surface. The film thickness of the third upper electrode EU3 over the interlayer dielectric INS3 is from 20 to 100 nm. However, since tungsten films are formed by a CVD method using $WF_6$ gas, the third upper electrode EU3 (i.e., a tungsten film) contains fluorine (F) as an impurity.

The third upper electrode EU3 is not necessarily limited to any tungsten (W) film. It is sufficient for the third upper electrode EU3 to be a film which is lower in electric resistivity than the first and second upper electrodes EU1 and EU2 and may contain an impurity.

In order to cover the upper electrode EU, an interlayer dielectric INS4 is formed on the upper electrode EU. In the logic circuit region LGC, the capacitive insulator film CINS and the upper electrode EU on the interlayer dielectric INS3 are removed, so that the interlayer dielectric INS4 is formed on the interlayer dielectric INS3. In the DRAM region DR, a contact hole CH3 is made in the interlayer dielectric INS4 to penetrate the interlayer dielectric INS4. In the logic circuit region LGC, a contact hole CH3 is made in a laminated structure of the stopper film STP1, and the interlayer dielectrics INS3 and INS4. Inside the contact hole CH3 in each of the DRAM region DR and the logic circuit region LGC, a plug electrode PLG3 which is made of a conductor film is formed. The interlayer dielectric INS4 is an insulator film such as a silicon oxide film. The plug electrode PLG3 is formed to have a laminated structure of the following two: a thin bather conductor film (such as a titanium nitride (TiN) film, a titanium (Ti) film or a laminated film of the two) functioning as a bather metal; and a main conductor film (such as a tungsten film) that is larger in film thickness than the barrier conductor film. In the DRAM region DR, the plug electrode PLG3 contacts the third upper electrode EU3 of the capacitive elements CON to be electrically coupled thereto. In the logic circuit region LGC, the plug electrode PLG3 contacts the plug electrode PLG2 and the interconnection M1 to be electrically coupled thereto.

In order to cover the plug electrodes PLG3, an interlayer dielectric INS5 is formed on the interlayer dielectric INS4. The interlayer dielectric INS5 is an insulator film, for example, a low-k film such as a silicon oxide film or a SiCOH film. Plural interconnection trenches CH4 are made in the interlayer dielectric INS5 to penetrate the interlayer dielectric INS5. Inside the interconnection trenches CH4, an interconnection M2 is formed. The interconnection M2 may be a copper interconnection, and is formed to have a laminated structure of the following two: a thin bather conductor film (such as a tantalum (Ta) film, a titanium nitride (TiN) film, a tantalum nitride (TaN) film, or a laminated film of two or more of these films) functioning as a barrier metal; and a main conductor film (such as a copper (Cu) film) that is larger in film thickness than the barrier conductor film. The interconnection M2 contacts the respective upper surfaces (main surfaces) of the plug electrodes PLG3 to be electrically coupled thereto.

Hereinafter, a further description will be made about the second and third upper electrodes EU2 and EU3, and a description will also be made about advantageous effects of the present embodiment.

In the DRAM region DR, for example, a determined supply electric potential Vcc or Gnd is supplied through the interconnection M2 and the plug electrode PLG3 to the upper electrode EU of the capacitive elements CON. In other words, the interconnection M2 and the plug electrode PLG3 in the DRAM region DR shown in FIG. 2 are electric-power supply means for the upper electrode EU of the capacitive elements CON. The electric-power supply means are arranged collectively, for example, at a peripheral portion of the DRAM cell array, so that, out of the entire DRAM cells, ones arranged at a central portion of the DRAM cell array are present at positions far from the electric-power supply means. When the electric resistance of the upper electrode EU is high, the electric potential of the upper electrode EU of the DRAM cells arranged at the central portion of the DRAM cell array fluctuates (deviates) from the supply electric potential to cause a problem that the quantity of charges accumulated in the capacitive elements CON is decreased. In order to solve this problem, the third upper electrode EU3, which is a metal film smaller in electric resistivity than the first and second upper electrodes EU1 and EU2, is laid to decrease the electric resistance of the upper electrode EU. In conclusion, even in the capacitive elements CON of the DRAM cells positioned at the central portion of the DRAM cell array, the electric potential of their upper electrode EU can be made substantially equal to the supply electric potential, so that the present embodiment has an advantageous effect that even in the DRAM cells at the central portion, sufficient electric charges can be accumulated into their capacitive elements CON.

When attention is paid to each of the capacitive elements CON, the present embodiment has an advantageous effect that a fluctuation in the electric potential of the upper electrode EU along/over the bottom surface of each of the capacitor-forming trenches CGV can be decreased by forming the third upper electrode EU3 deeply inside the capacitor-forming trench CGV. It is therefore effective for decreasing the electric potential fluctuation of the upper electrode EU that the third upper electrode EU3 contacts the second upper electrode EU2 at the bottom of the capacitor-forming trench CGV.

As described above, the second upper electrode EU2 is a barrier film for preventing the diffusion of the impurity, such as fluorine (F), contained in the third upper electrode EU3 into the first upper electrode EU1 or the capacitive insulator film CINS. Accordingly, the present embodiment has an advantageous effect that a leakage in the capacitive insulator film CINS can be prevented or decreased by interposing the second upper electrode EU2, which is a bather film, between the third upper electrode EU3, and the first upper electrode EU1 or the capacitive insulator film CINS.

Furthermore, a more effective result is obtained by making the second upper electrode EU2 higher (or larger) in film density than the first upper electrode EU1. The use of a metal film or metal-element-containing layer high in film density as the second upper electrode EU2 makes it possible to improve the advantageous effect of preventing or decreasing the impurity diffusion, thereby forming the second upper electrode EU2 thinly. The matter that the second upper electrode EU2 can be made thin makes it possible to form the third upper electrode EU3 deeply inside the first and second upper electrodes EU1 and EU2 positioned inside each of the capacitor-forming trenches CGV to decrease a fluctuation in the electric potential of the upper electrode EU at the bottom of the capacitor-forming trench CGV also.

It is also important that the second upper electrode EU2 does not have any hole (opening) or any other that is to be a path through which fluorine (F) diffuses. Since the second upper electrode EU2 is made of a metal film or a metal-element-containing film, it is unnecessary to make any opening (connecting hole or bore) through which the first and third upper electrodes EU1 and EU2 are electrically coupled to each other. In the region of the DRAM cell array, the upper electrode EU2 is a film which covers the first upper electrode EU1 completely and has no opening, and further covers the front surface (upper surface) of the first upper electrode EU1 completely in each of the capacitor-forming trenches CGV also.

For reference, the capacitive insulator film CINS, and the first, the second and the third upper electrodes EU1, EU2 and EU3 have plane-shapes equal to each other in design. This matter means that a single mask is used to work (pattern) the third, the second and the first electrodes EU3, EU2 and EU1, and the capacitive insulator film CINS successively. In other words, plane-shapes having a difference in finish dimension that follows the working, such as etching, are included in the category denoted by the wording "plane-shapes equal to each other in design". It is not essential that the second upper electrode EU2 is equal in plane-shape to the first upper electrode EU1. It is important that the second upper electrode EU2 completely covers the front surface (upper surface) of the first upper electrode EU1 when viewed in plan. It is therefore allowable that the second upper electrode EU2 is larger in plane-size than the first upper electrode EU1. The second upper electrode EU2 completely covers the front surface of the first upper electrode EU1; thus, it is possible to prevent the impurity diffusion from the third upper electrode EU3 to the first upper electrode EU1 or the capacitive insulator film CINS. It is therefore possible to decrease a leakage in the capacitive insulator film CINS.

The following will describe a method for producing the semiconductor integrated circuit device of the present embodiment.

Figure 3:
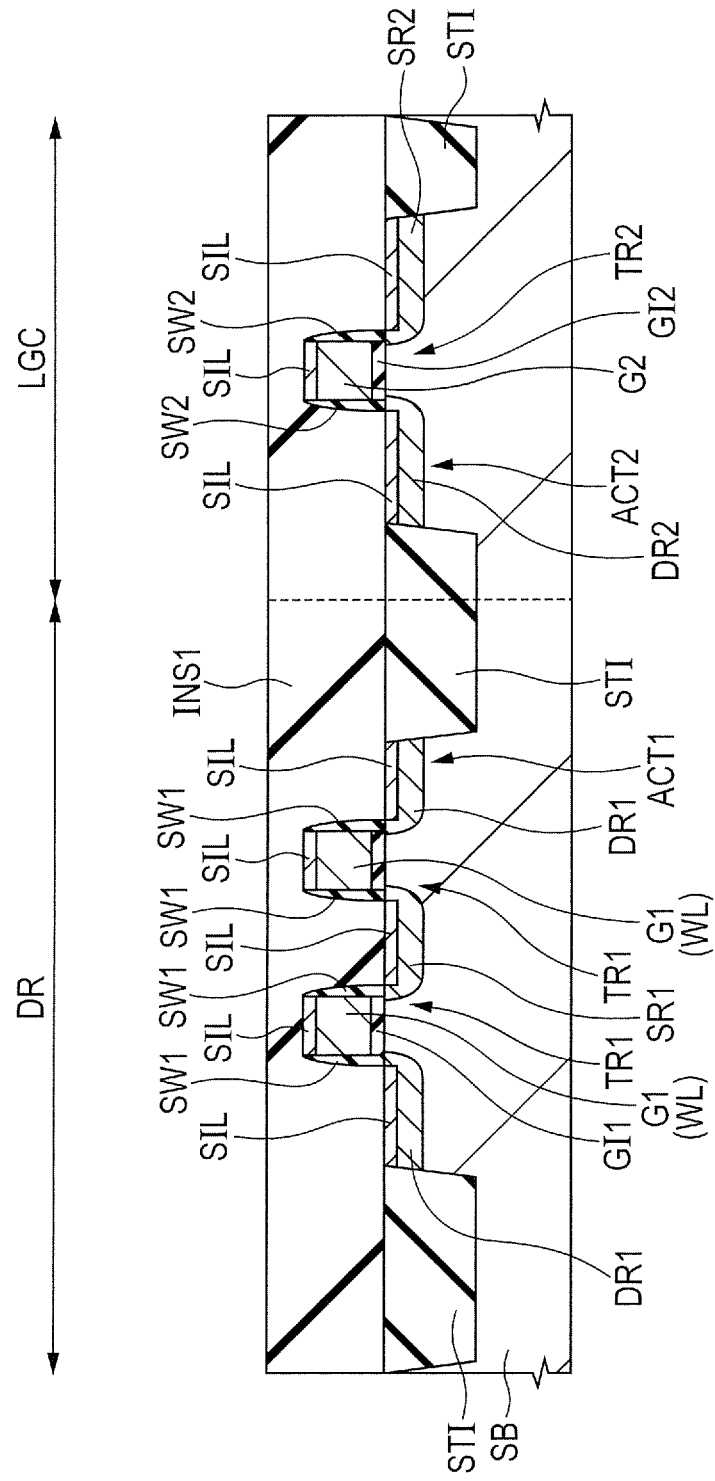
FIG. 3 is a sectional view of a main portion of a workpiece of the semiconductor integrated circuit device of the First embodiment, the view demonstrating a method for producing this device.

FIGS. 3 to 10 are each a sectional view illustrating a main portion of a workpiece of the semiconductor integrated circuit device of the present embodiment when this device is produced. FIG. 3 is a view referred to for describing the step of preparing a semiconductor substrate SB in which selective MISFETs (TR1) and a logic MISFET (TR2) are formed, and the step of forming an interlayer dielectric INS1. The selective MISFETs (TR1) are formed in a DRAM region DR of the semiconductor substrate SB, and the logic MISFET (TR2) is formed in a logic circuit region LGC thereof. In order to cover the selective MISFETs (TR1) and the logic MISFET (TR2), the interlayer dielectric INS1 is formed on a main surface of the semiconductor substrate SB. Specifically, a silicon oxide film, which is to be the interlayer dielectric INS1, is formed onto the main surface of the semiconductor substrate SB by, for example, a plasma-enhanced chemical vapor deposition (plasma CVD). The film thickness of the silicon oxide film is made larger than a film thickness (for example, about 350 nm) permitting a space between gate electrodes G1 adjacent to each other to be completely embedded with the silicon oxide film. Next, the interlayer dielectric INS1 is subjected to chemical mechanical polishing (CMP) treatment to flatten the front surface of the interlayer dielectric INS1, thereby forming the interlayer dielectric INS1 to have a flat main surface (upper surface).

Figure 4:
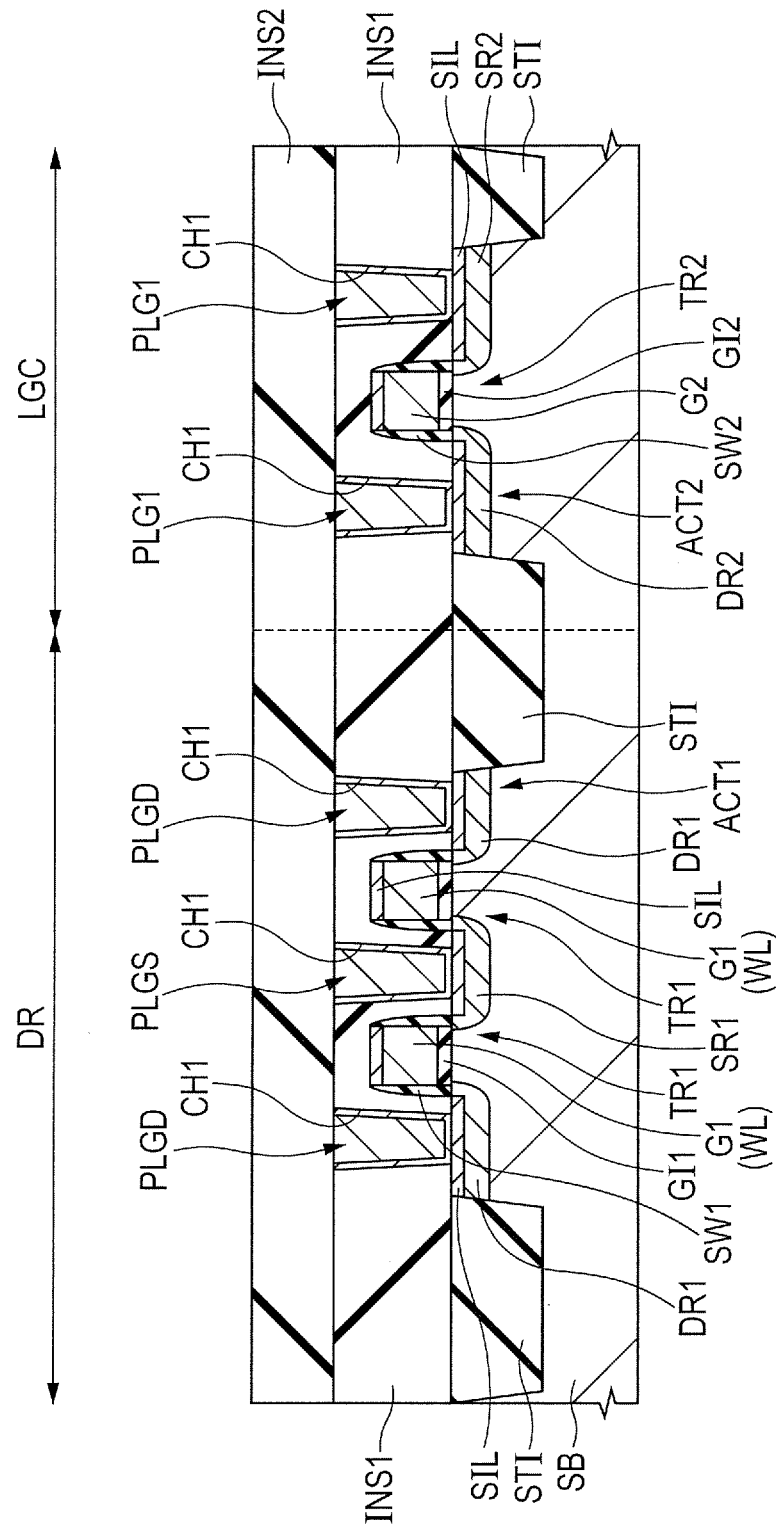
FIG. 4 is a sectional view which is equivalent to FIG. 3 but demonstrates a step after the step illustrated in FIG. 3 in this method.

FIG. 4 is a view referred to for describing the step of making contact holes CH1 in the interlayer dielectric INS1, the step of forming plug electrodes into the contact holes CH1, and the step of forming an interlayer dielectric INK thereon. A resist film PR1 (not illustrated) that is an insulator film is formed on the interlayer dielectric INS1. The resist film PR1 has openings corresponding to the contact holes CH1. The resist film PR1 is used as a mask to subject the interlayer dielectric INS1 to dry etching, thereby making the contact holes CH1 in the interlayer dielectric INS1.

Next, a bather conductor film and a main conductor film are successively formed (or deposited) onto the interlayer dielectric INS1. The formation of the barrier conductor film and the main conductor film is performed to give a film thickness permitting the contact holes CH1 to be completely embedded with these films. Thereafter, the main conductor film is subjected to CMP treatment to remove the main conductor film and the barrier conductor film on the interlayer dielectric INS1. By the CMP treatment, the main conductor film and the bather conductor film are caused to remain only inside the contact holes CH1, thereby forming a source plug electrode PLGS, drain plug electrodes PLGD and plug electrodes PLG1, each of these electrodes being made of the laminated film of the barrier conductor film and the main conductor film.

Next, in order to cover the source plug electrode PLGS, the drain plug electrodes PLGD and the plug electrodes PLG1, an interlayer dielectric INK is formed on the interlayer dielectric INS1 by a PCVD method.

Figure 5:
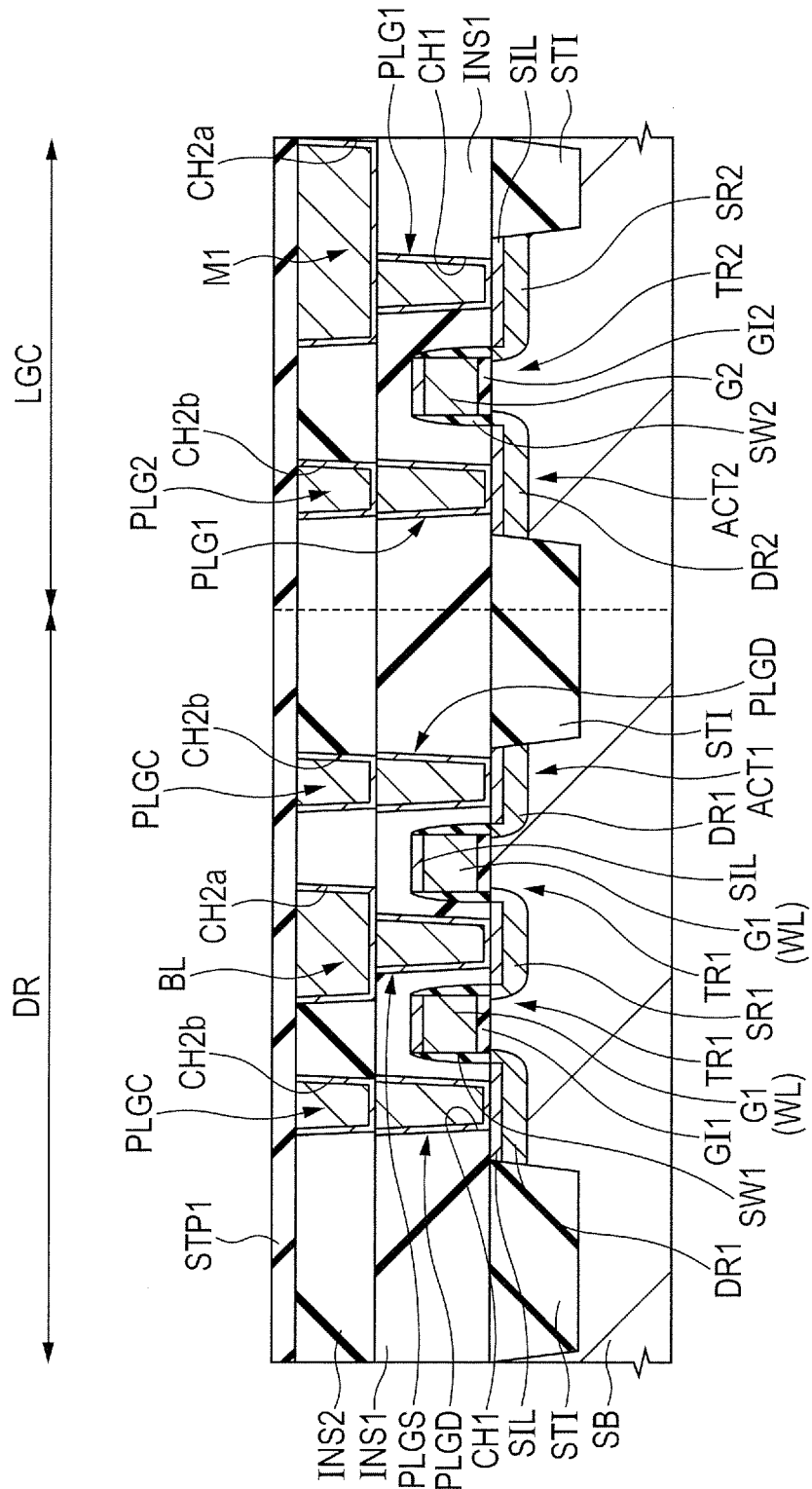
FIG. 5 is a sectional view which is equivalent to FIG. 3 but demonstrates a step after the step illustrated in FIG. 4.

FIG. 5 is a view referred to for describing the step of forming capacitive plug electrodes PLGC, a bit line BL, a plug electrode PLG2, and an interconnection M1, and the step of forming a stopper film STP1. Onto the interlayer dielectric INK, a resist film PR2 (not illustrated) is formed which has openings corresponding to the capacitive plug electrodes PLGC, the bit line BL, the plug electrode PLG2 and the interconnection M1. Next, the resist film PR2 is used as a mask to subject the interlayer dielectric INK to dry etching, thereby making contact holes CH2b and interconnection trenches CH2a in the DRAM region DR and the logic circuit region LGC.

Next, a bather conductor film and a main conductor film are successively formed (or deposited) on the interlayer dielectric INS2. The formation of the barrier conductor film and the main conductor film is performed to give a film thickness permitting the interconnection trenches CH2a and the contact holes CH2b to be completely embedded with these films. Thereafter, the main conductor film and the barrier conductor film are subjected to CMP treatment to remove the main conductor film and the barrier conductor film on the interlayer dielectric INS2. By the CMP treatment, the main conductor film and the barrier conductor film are caused to remain only inside the interconnection trenches CH2a and the contact holes CH2b, thereby forming capacitive plug electrodes PLGC, a plug electrode PLG2, a bit line and an interconnection M1, each of these members being made of the laminated film of the bather conductor film and the main conductor film.

Next, in order to cover the capacitive plug electrodes PLGC, the plug electrode PLG2, the bit line BL and the interconnection M1, a stopper layer STP1 is formed (or deposited) on the interlayer dielectric INK by a PCVD method.

Figure 6:
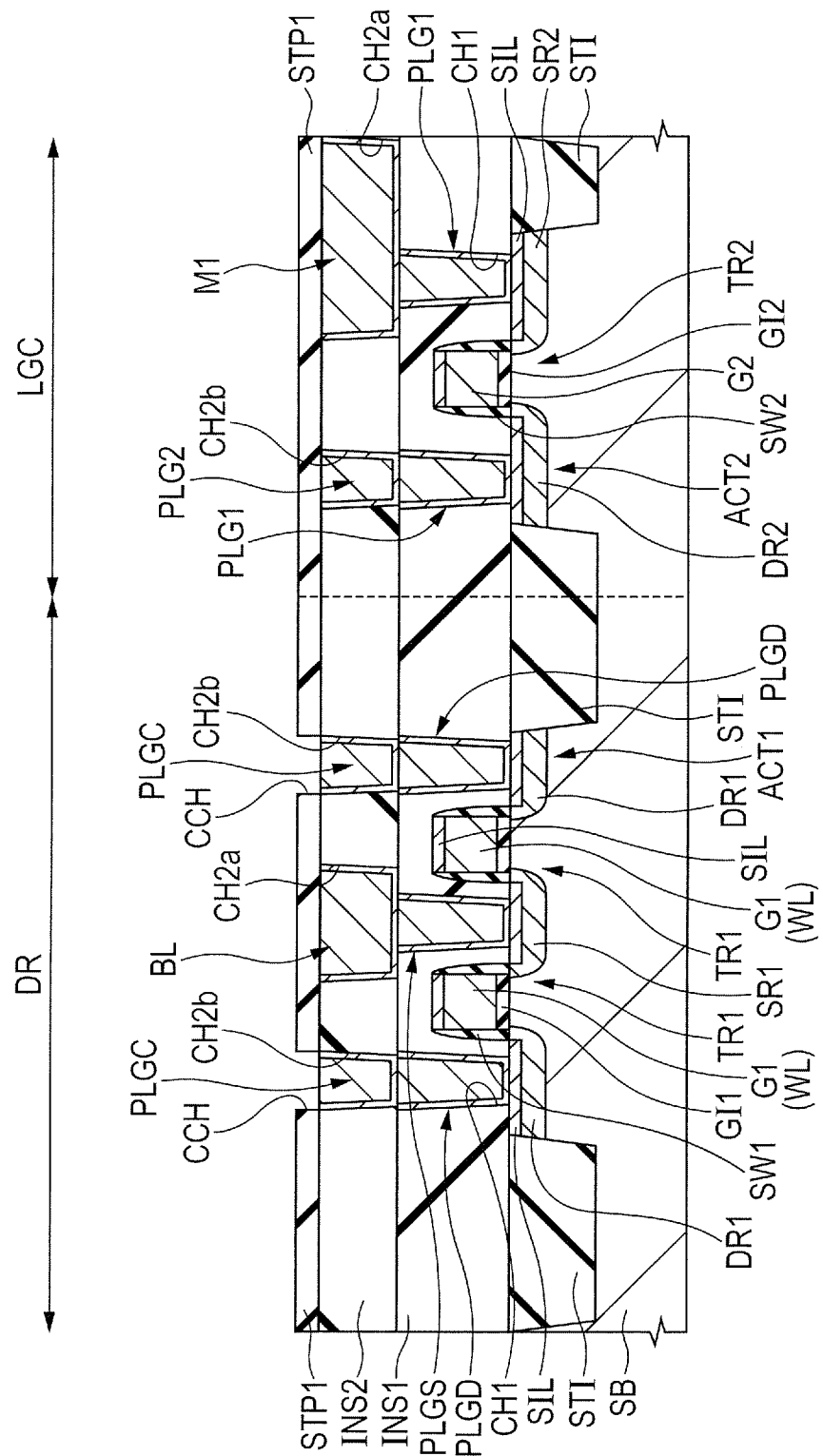
FIG. 6 is a sectional view which is equivalent to FIG. 3 but demonstrates a step after the step illustrated in FIG. 5.

FIG. 6 is a view referred to for describing the step of making capacitive contact holes CCH in the stopper layer STP1. Onto the stopper film STP1, a resist film PR3 (not illustrated) is formed which is an insulator film having openings corresponding to the capacitive contact holes CCH. The resist film PR3 is used as a mask to subject the stopper film STP1 to dry etching, thereby making the capacitive contact holes CCH. The capacitive contact holes CCH are made on the capacitive plug electrodes PLGC to make the respective tops (upper surfaces) of the capacitive plug electrodes PLGC naked.

Figure 7:
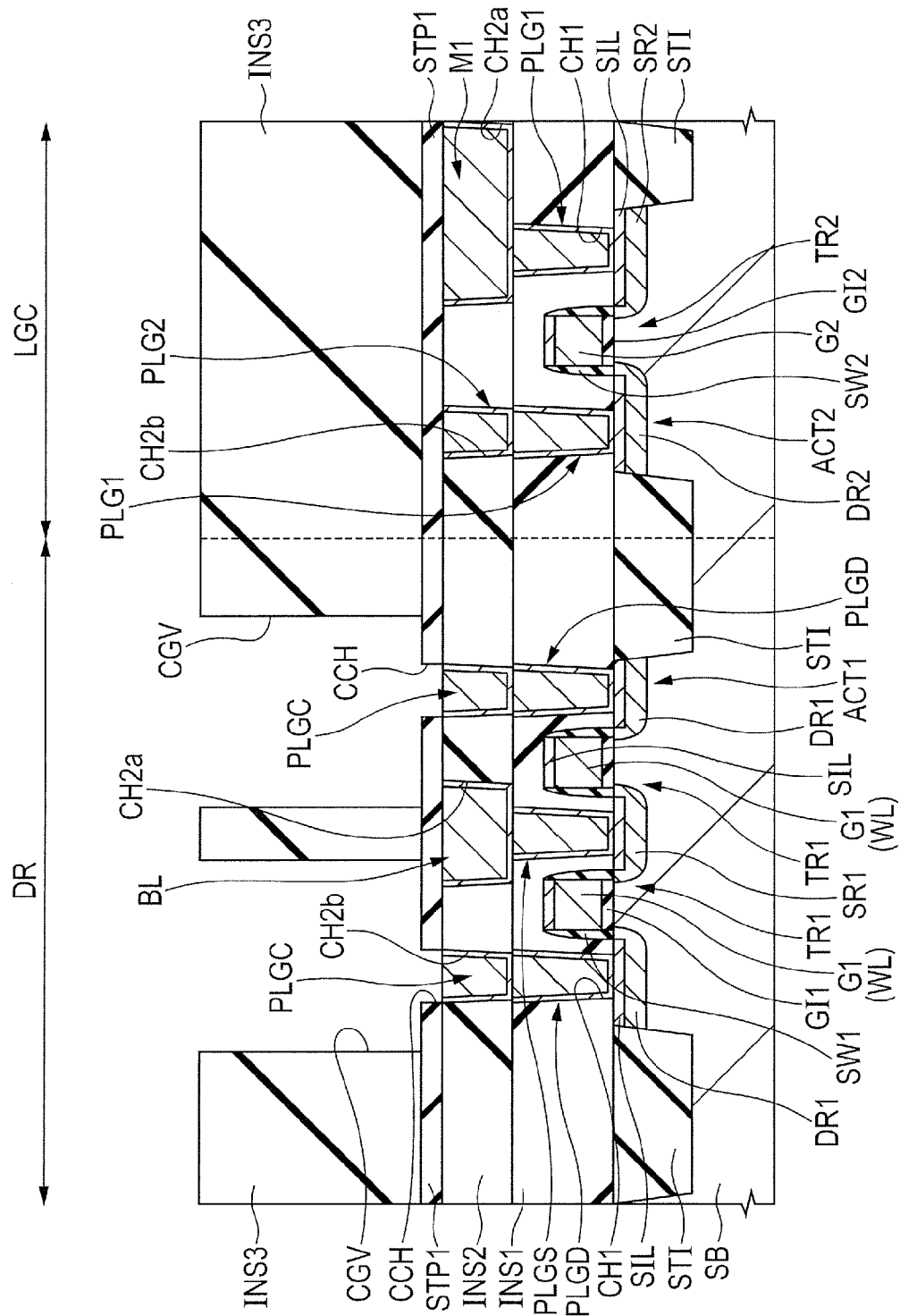
FIG. 7 is a sectional view which is equivalent to FIG. 3 but demonstrates a step after the step illustrated in FIG. 6.

FIG. 7 is a view referred to for describing the step of forming an interlayer dielectric INS3 having capacitor-forming trenches CGV. The interlayer dielectric INS3, which is an insulator film, is formed (or deposited) onto the stopper film STP1 by a plasma CVD method. Next, onto the interlayer dielectric INS3, a resist film PR4 (not illustrated) is formed which is an insulator film having openings corresponding to a pattern of the capacitor-forming trenches CGV. The resist film PR4 is used as a mask to subject the interlayer dielectric INS3 to dry etching, thereby making the capacitor-forming trenches CGV. In the DRAM region DR, the capacitor-forming trenches CGV are each formed on any one of the capacitive plug electrodes PLGC. The stopper film STP1, the capacitive contact holes CCH and the capacitive plug electrodes PLGC are exposed to the bottom of the capacitor-forming trenches CGV.

Figure 8:
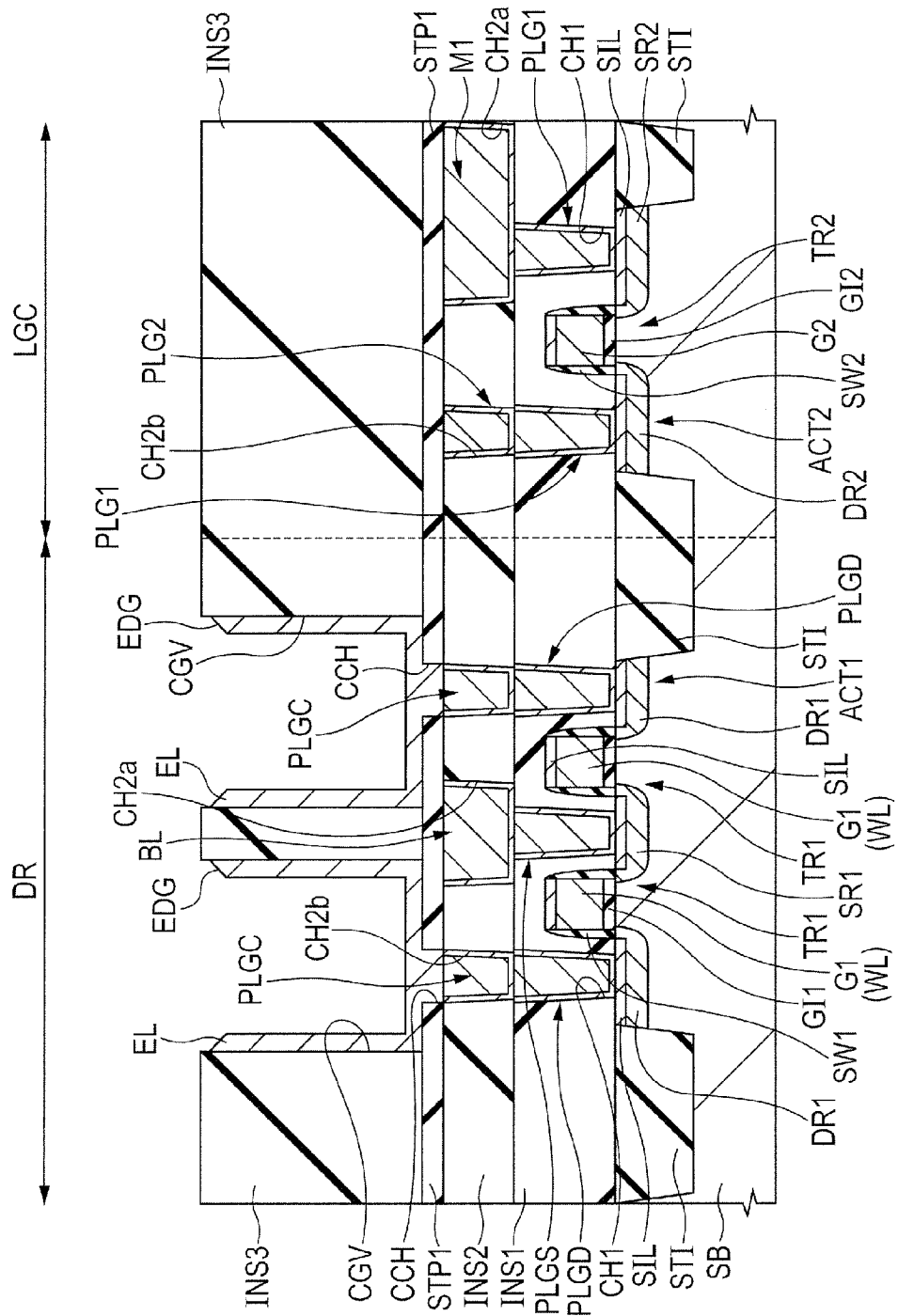
FIG. 8 is a sectional view which is equivalent to FIG. 3 but demonstrates a step after the step illustrated in FIG. 7.

FIG. 8 is a view referred to for describing the step of forming lower electrodes EL. Each of the lower electrodes EL, which is made of a conductor film, is formed into a small and even thickness, along/on the side wall and the bottom surface of any one of the capacitor-forming trenches CGV, in such a manner that the capacitor-forming trench CGV is not embedded with the lower electrode EL. The lower electrode EL is made of a titanium nitride (TiN) formed by an MOCVD method. The titanium nitride (TiN) film can be formed into a desired thickness, for example, by repeating, plural times, a cycle of depositing tetrakisdimethylaminotitanium (TD-MAT) into the capacitor-forming trench CGV and then subjecting the resultant TDMAT layer to plasma treatment with a mixed gas of hydrogen and nitrogen for 5 to 40 seconds. The lower electrode EL is formed also in any one of the capacitive contact holes CCH to contact the upper surface of one of the capacitive plug electrodes PLGC. The lower electrode EL is separated from the other lower electrode EL, which is formed in the capacitor-forming trench CGV adjacent to the former lower electrode EL. An end EDG of the lower electrode EL, i.e., each of the lower electrodes EL, is not extended to the upper surface (main surface) of the interlayer dielectric INS3 to be terminated at a position below the upper surface (main surface) of the interlayer dielectric INS3.

After the formation of the lower electrode EL, the workpiece is annealed to crystalize the titanium nitride film. The annealing is performed in an atmosphere of, for example, a nitrogen ($N_2$) at a temperature range from 340 to 450° C. Instead of the nitrogen atmosphere, an atmosphere of, for example, argon (Ar) or helium (the) is usable.

Figure 9:
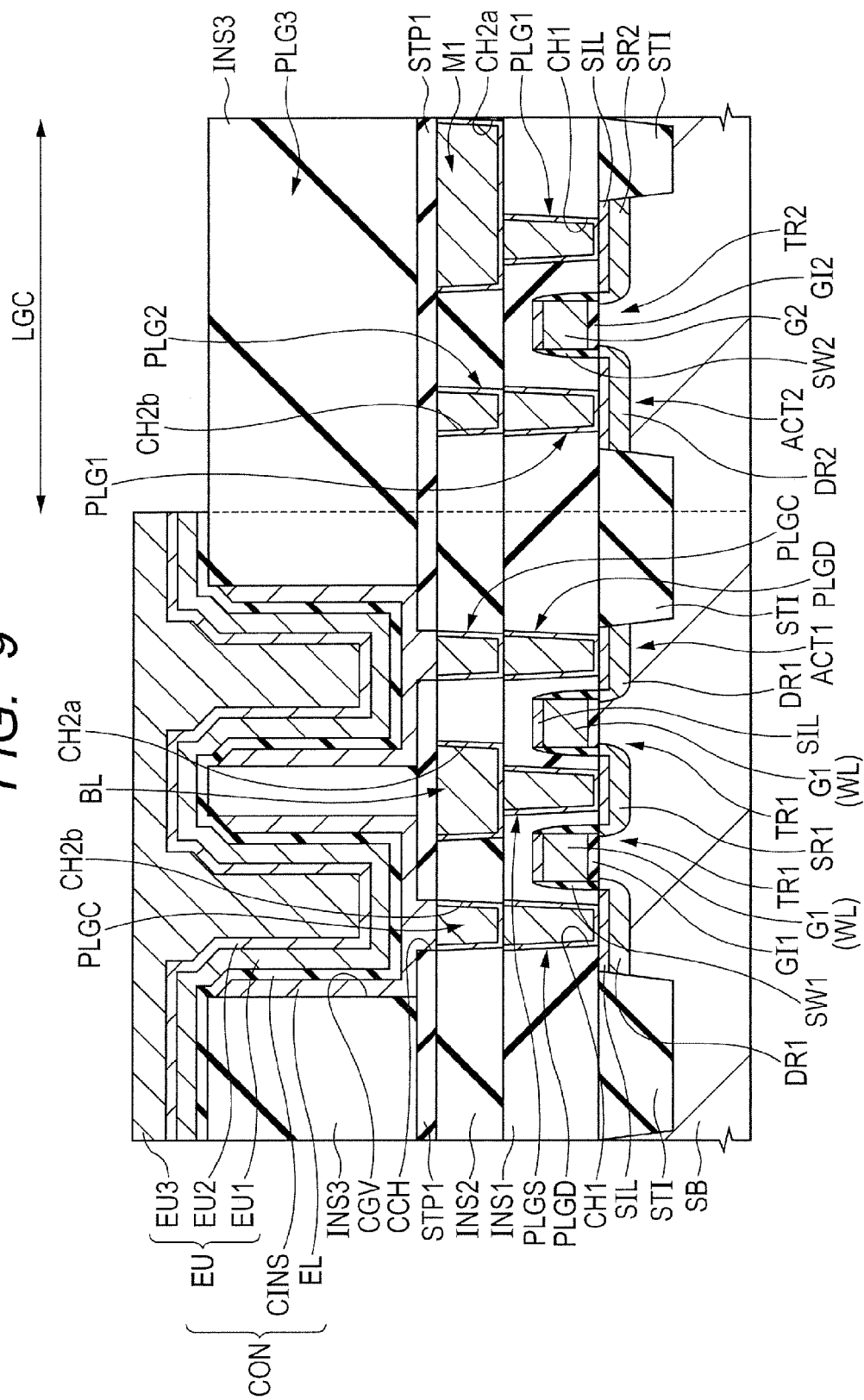
FIG. 9 is a sectional view which is equivalent to FIG. 3 but demonstrates a step after the step illustrated in FIG. 8.

FIG. 9 is a view referred to for describing the step of forming a capacitive insulator film CINS, and an upper electrode EU. The capacitive insulator film CINS, which is a zirconium oxide ($ZrO_2$) film, is formed (or deposited) along/on or over the upper surface of the lower electrode EL by an ALD method. For example, the following cycle is used: a cycle including a first step of using tetraethylmethylaminozirconium (TEMAZ) containing zirconium (Zr) as a raw material gas to deposit zirconium (Zr) into a single-atom layer on the lower electrode EL, and a second step of supplying an oxidizer such as ozone ($O_3$) onto the front surface of the zirconium (Zr) layer to form a zirconium oxide ($ZrO_2$) film. This cycle is repeated plural times to form the capacitive insulator film CINS, which is the zirconium oxide ($ZrO_2$) film, into a desired film thickness.

After the formation of the capacitive insulator film CINS, the workpiece is annealed. For example, the workpiece is annealed in an atmosphere of, for example, nitrogen ($N_2$), argon (Ar), or helium (He) at a temperature higher than the temperature for forming the capacitive insulator film CINS. This annealing makes it possible to improve the capacitive insulator film CINS in film quality and dielectric constant.

Next, a first upper electrode EU1 is formed on the front surface of the capacitive insulator film CINS. The first upper electrode EU1 is made of a titanium nitride (TiN) film formed by an MOCVD method. For example, the following cycle is used: a cycle including a first step of depositing tetrakisdimethylaminotitanium (TDMAT) on the upper surface of the capacitive insulator film CINS in FIG. 9, and a second step of subjecting the resultant TDMAT layer to plasma treatment with a mixed gas of hydrogen and nitrogen for 5 to 40 seconds. This cycle is performed once, or repeated plural times to form the titanium nitride (TiN) film into a desired film thickness. According to the formation of the first upper electrode EU1 by the MOCVD method, a plasma damage onto the capacitive insulator film CINS can be made smaller than according to that by an ALD method or PVD method. Thus, a leakage in the capacitive insulator film CINS can be decreased.

Next, a second upper electrode EU2 is formed on the front surface of the first upper electrode EU1. The second upper electrode EU2 may be made of a titanium nitride (TiN) film formed by an ALD method. The titanium nitride (TiN) film can be formed into a desired thickness, for example, by repeating the following cycle 7 to 33 times: a cycle of exposing the semiconductor substrate SB in FIG. 9 over which the first upper electrode EU1 has been formed but no more member has been formed to tetrakisdimethylaminotitanium (TDMAT) as a raw material gas to form a single layer of TDMAT, and then subjecting this single TDMAT layer to plasma treatment with nitrogen gas for 2 to 10 seconds.

By making the second upper electrode EU2 larger in film density than the first upper electrode EU1, a bather layer resisting the diffusion of impurities from a third upper electrode EU3, which will be described just below, can be formed as a thin film. When the second upper electrode EU2 is, for example, a titanium nitride (TiN) film by an ALD method, this film can be formed as a dense film by elongating the period for the plasma treatment with the nitride gas. In accordance with the repeated number of the cycle, the film thickness thereof can be controlled.

Next, the third upper electrode EU3 referred to the above is formed onto the front surface of the second upper electrode EU2. The third upper electrode EU3 is a tungsten (W) film formed by a CVD method using $WF_6$ gas. The third upper electrode EU3 is formed on the upper surface of the second upper electrode EU2 formed along/over the bottom surface and the side wall of each of the capacitor-forming trenches CGV. The third upper electrode EU3 is formed into a sufficiently large thickness in such a manner that the capacitor-forming trench CGV is completely embedded with the third upper electrode EU3. Thereafter, the front surface of the tungsten (W) film is subjected to CMP polishing to complete the third upper electrode EU3 in the DRAM cell array as illustrated in FIG. 9, so as to have a substantially flat surface (upper surface). Next, a resist film PR5 (not illustrated) is used to work (pattern) the third upper electrode EU3, the second upper electrode EU2, the first upper electrode EU1, and the capacitive insulator film CINS in turn, thereby forming, in the DRAM region DR, the third upper electrode EU3, the second upper electrode EU2, the first upper electrode EU1, and the capacitive insulator film CINS, which have, respectively, plane-shapes equal to each other in design. In other words, this working (patterning) attains the removal of the third upper electrode EU3, the second upper electrode EU2, the first upper electrode EU1, and the capacitive insulator film CINS in the logic circuit region LGC.

The capacitive insulator film CINS and the upper electrode EU are each arranged commonly or singly for the plural lower electrodes EL. Specifically, in the DRAM region DR, the capacitive insulator film CINS and the upper electrode EU are continuously extended from the respective insides of the capacitor-forming trenches CGV adjacent to each other to the interlayer dielectric INS3 between these capacitor-forming trenches CGV.

Figure 10:
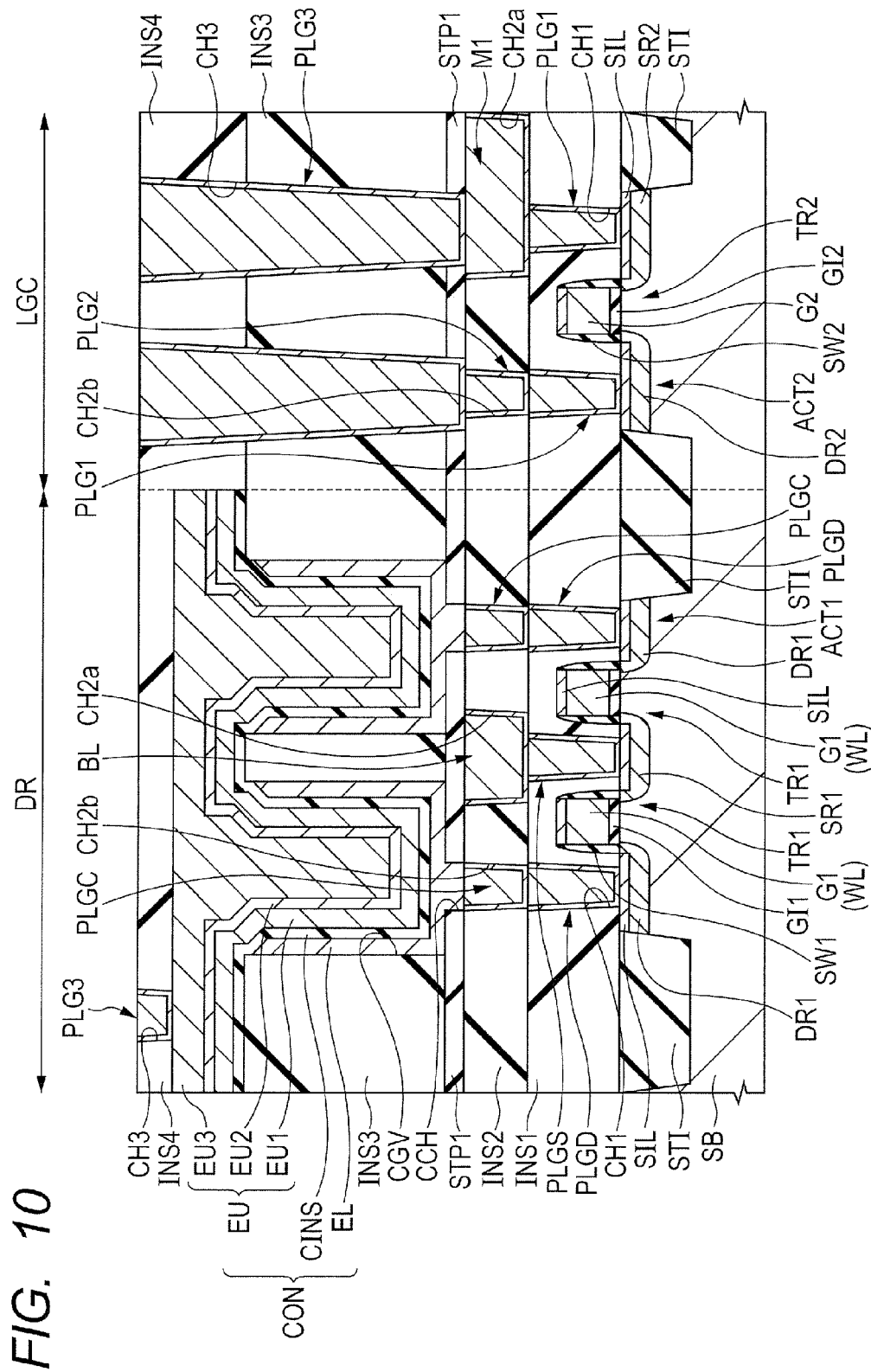
FIG. 10 is a sectional view which is equivalent to FIG. 3 but demonstrates a step after the step illustrated in FIG. 9.

FIG. 10 is a view referred to for describing the step of forming an interlayer dielectric INS4 and plug electrodes PLG3. In order to cover the upper electrode EU in the DRAM region DR and the interlayer dielectric INS3 in the logic circuit region LGC, the interlayer dielectric 4, which is an insulator film, is formed by a CVD method. The interlayer dielectric INS4 is, for example, a silicon oxide film formed by a plasma CVD method. In the step of forming this interlayer dielectric INS4, a thermal load of 400° C. or higher is applied to the semiconductor substrate SB. After the interlayer dielectric INS4 is deposited by the plasma CVD method, CMP treatment is applied to the interlayer dielectric INS4 in the DRAM region DR and the logic circuit region LGC to flatten the front surface of the interlayer dielectric INS4.

Next, in the DRAM region DR, one of the plug electrode PLG3 is located to penetrate the interlayer dielectric INS4, and thus the plug electrode PLG3 is brought into contact with the upper electrode EU so that the two are electrically coupled to each other. In the logic circuit region LGC, the other plug electrode PLG3 is located to penetrate the interlayer dielectric INS4, the interlayer dielectric INS3 and the stopper film STP1, and thus the plug electrode PLG3 is brought into contact with the plug electrode PLG2 and the interconnection M1, so as to be electrically coupled to the plug electrode PLG2 and the interconnection M1. In the DRAM region DR and the logic circuit region LGC, contact holes CH3 in each of which one of the plug electrodes PLG3 is formed are different in depth from each other; however, the contact holes CH3 are simultaneously made, using, for example, a dry etching method. When the contact holes CH3 are made, the upper electrode EU functions, in the DRAM region DR, as an etching stopper for stopping the etching of the interlayer dielectric INS4 and the interlayer dielectric INS3; and the stopper film STP1 does, in the Logic circuit region LGC, as the same.

Next, in order to cover the plug electrodes PLG3, an interlayer dielectric INS5, which is an insulator film such as a silicon oxide film, is formed by, for example, a plasma CVD method. Also in this step of forming the interlayer dielectric INS5, a thermal load of 400° C. or higher is applied to the semiconductor substrate SB. Thereafter, interconnection trenches CH4a are made in the interlayer dielectric INS5, and then an interconnection M2 made of a copper interconnection is formed inside the interconnection trenches CH4a to complete the structure illustrated in FIG. 2. In the DRAM region DR, the interconnection M2 is electrically coupled to the upper electrode EU of the capacitive elements CON through the plug electrode PLG3, so that through the interconnection M2, a predetermined voltage is supplied to the upper electrode EU. In the logic circuit region LGC, the interconnection M2 is electrically coupled to the source region SR2 or drain region DR2 of the logic MISFET (TR2), so that through the interconnection M2, a predetermined electric potential or signal is supplied to the source region SR2 or the drain region DR2 of the logic MISFET (TR2).

In the present embodiment, the step of forming the second interconnection layer and the steps previous thereto have been described. Actually, however, steps of forming interconnections that are plural layers will be performed. In each of the steps, a thermal load generated at the time of the formation of an interlayer dielectric therefor will be applied to the semiconductor substrate SB.

When impurities, such as fluorine (F), contained in the tungsten (W) film, of which the third upper electrode EU3 is made, are diffused into the capacitive insulator film CINS by the thermal load in any one of the interlayer-dielectric-forming steps after the formation of the capacitive elements CON, a leakage is generated in the capacitive insulator film CINS. In the present embodiment, between the third upper electrode containing the impurities, and the first upper electrode EU1 or the capacitive insulator film CINS, the second upper electrode EU2, which functions as a barrier film against the diffusion of the impurities, is interposed. Thus, even when the thermal load in the interconnection-forming step is applied to the capacitive elements CON, a leakage can be prevented in the capacitive insulator film CINS.

Figure 11:
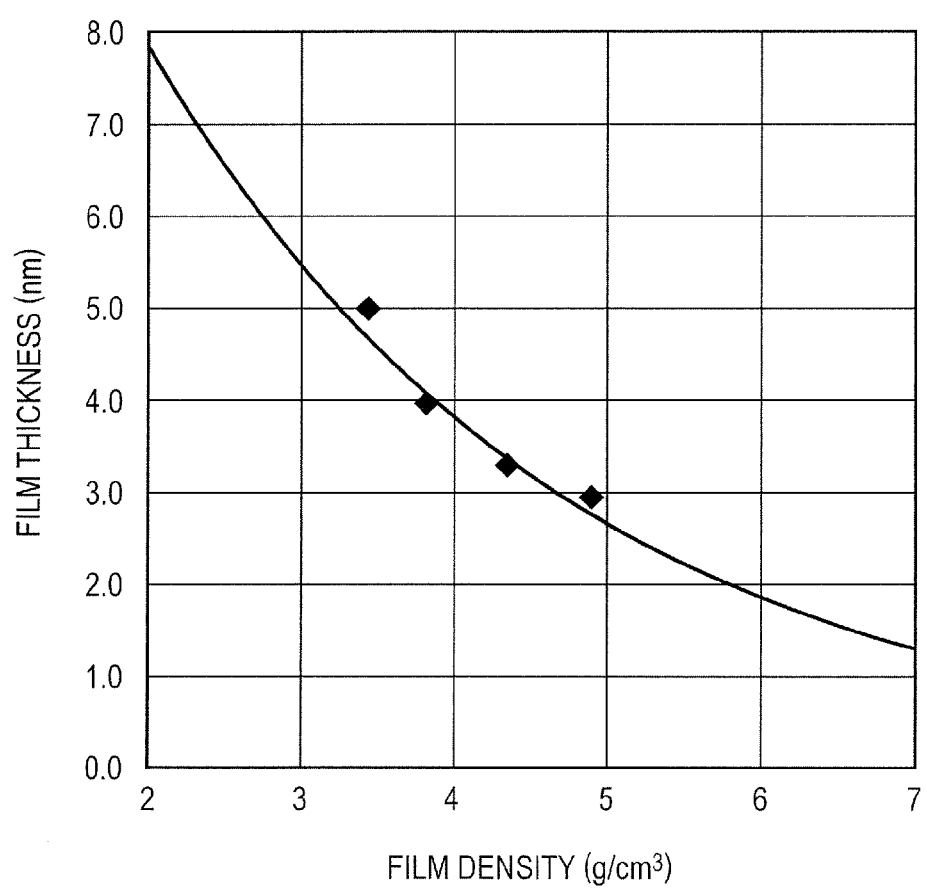
FIG. 11 is a graph showing a relationship between the film density and the film thickness of a barrier film.

FIG. 11 is a graph showing a relationship between the film density of the bather film and the film thickness thereof. FIG. 11 specifically shows the following: in the case of rendering the bather film a titanium nitride (TiN) film, a relationship between the film density (X) of the titanium nitride (TiN) film and the film thickness (Y) thereof that are necessary for reducing the concentration of fluorine (F) passing through the barrier film by one digit. The relationship between the two is represented by the following expression:

$$Y = 16.1 e^{-0.36X} \quad (1)$$

It is therefore effective to use, as the barrier film, a titanium nitride (TiN) film satisfying the following expression:

$$"Y0" \geq 16.1 e^{-0.36 "X0"} \quad (2)$$

wherein X0 represents a predetermined film density of the film; Y0, the film thickness thereof that corresponds to the predetermined film density. When the fluorine (F) concentration can be reduced by one digit, the capacitive elements CON of the MIM structure can be sufficiently prevented from undergoing a leakage deterioration.

Figure 12:
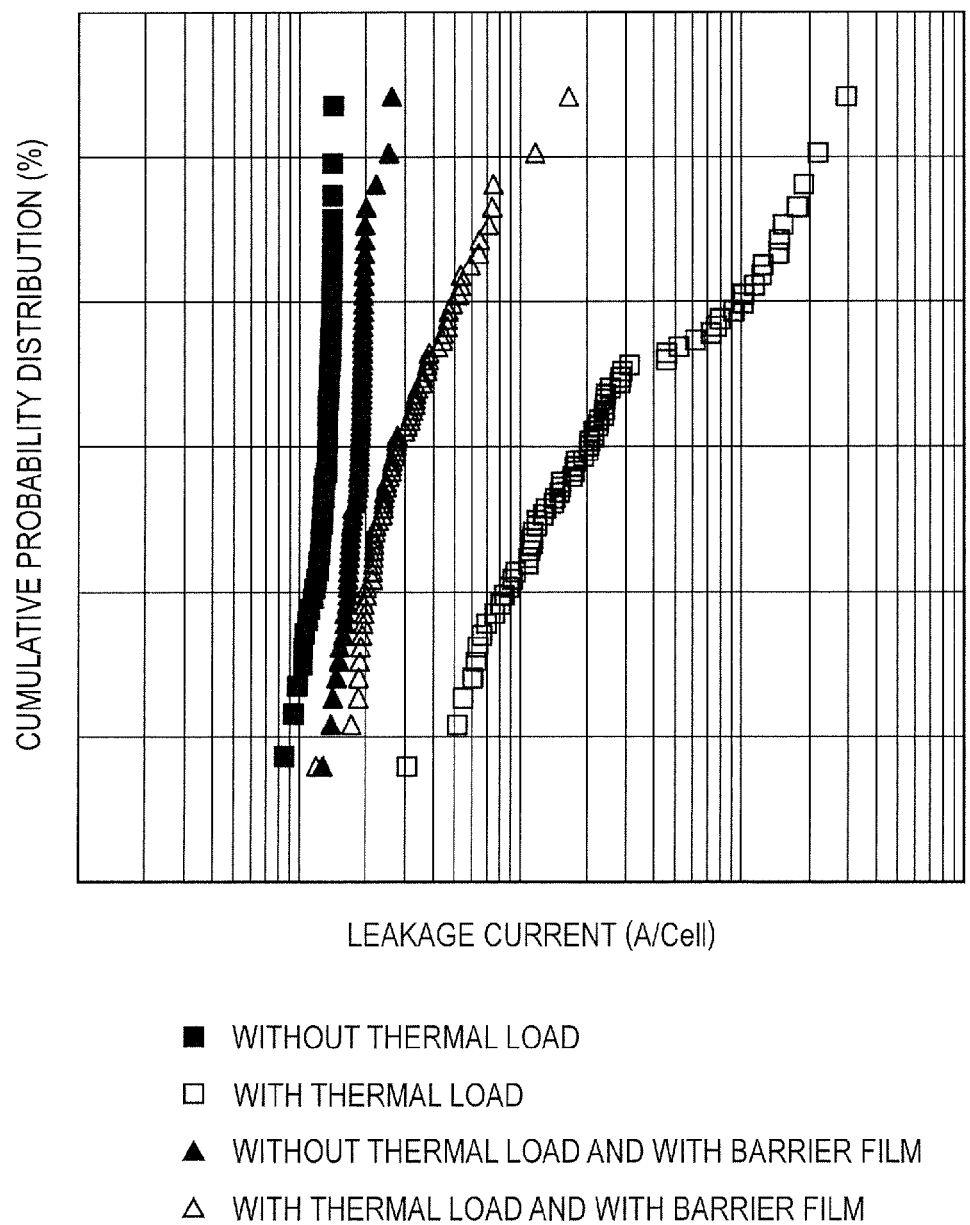
FIG. 12 is a graph showing a relationship between the leakage current of each capacitive element species and a cumulative probability distribution of samples of the species.

FIG. 12 is a graph showing a relationship between the leakage current of each of two species of capacitive elements CON each having an MIM structure and a cumulative probability distribution of samples of the species. A comparison was made about leakage current between one of the two species, i.e., a case of making the upper electrode EU into a bilayered structure of the first upper electrode EU1 (titanium nitride film having a film thickness of 30 nm) and the third upper electrode EU3, and the other species, i.e., a case of making the upper electrode EU into a trilayered structure of the first upper electrode EU1 (titanium nitride film having a film thickness of 30 nm), the second upper electrode EU2 (bather film) and the third upper electrode EU3. As id evident from the results, in the case of laying no barrier film, the leakage current is increased by the thermal load. However, by laying the barrier film, the leakage current based on the thermal load can be decreased by about one digit. The used barrier film was a titanium nitride (TiN) film having a film density of 4.35 g/cm$^3$ and a film thickness of about 3 nm. About the thermal load, an annealing was conducted at 420° C. for 50 minutes on the supposition that an interconnection-forming step (as described above) is simulated.

Figure 13:
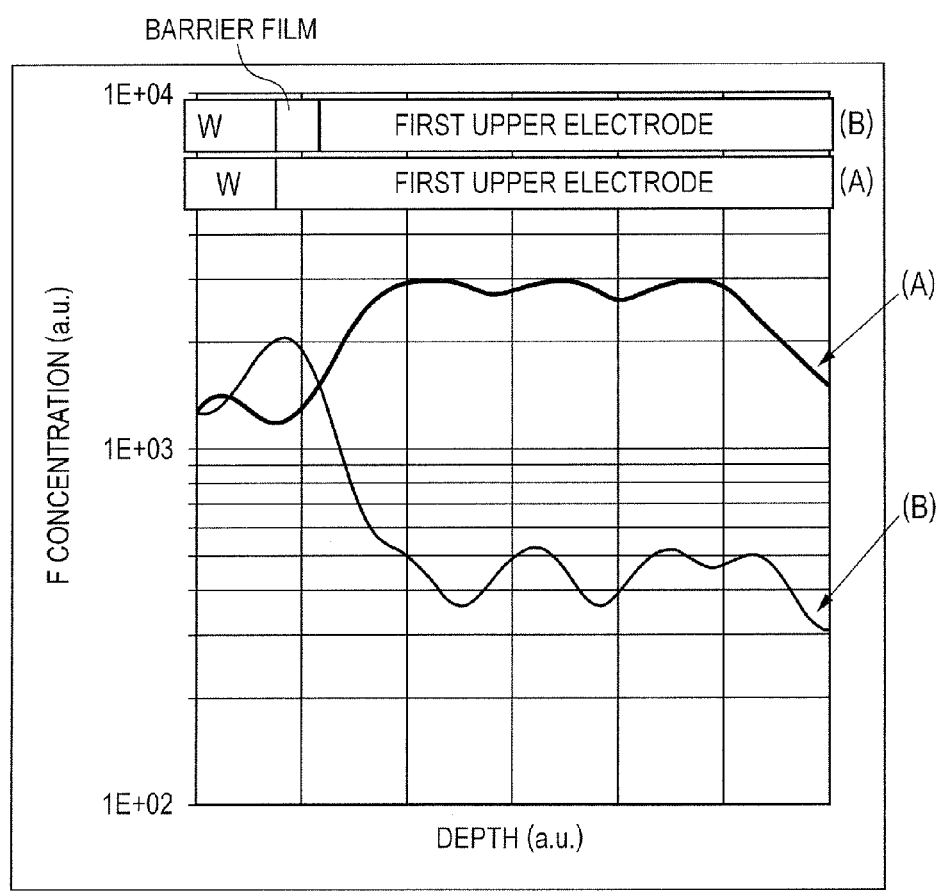
FIG. 13 is a graph showing a concentration distribution of fluorine in the depth direction of each sample of a first upper electrode.

FIG. 13 is a view showing a concentration distribution of fluorine in the depth direction of each of two samples of the first upper electrode EU1. One (A) of the two samples was prepared by laying, for example, a tungsten (W) film (third upper electrode EU3) containing fluorine (F) onto, for example, a titanium nitride (TiN) film (first upper electrode EU1). The other sample (B) was prepared by laying, for example, a tungsten (W) film (third upper electrode EU3) containing fluorine (F) onto a titanium nitride (TiN) film (first upper electrode EU1) to interpose, therebetween, a bather film (second upper electrode EU2) which was a titanium nitride (TiN) film. Next, the samples (A) and (B) were annealed, for example, at 420° C. for 50 minutes. About each of the annealed samples (A) and (B), a distribution of the fluorine (F) concentration was measured from the front surface of the tungsten (W) film. The results are shown in FIG. 13. It is understood that by laying the barrier film, the concentration of fluorine (F) diffusing into the first upper electrode EU1 can be decreased by about one digit. The used bather film was a titanium nitride (TiN) film having a film density of 4.35 g/cm$^3$ and a film thickness of about 3 nm.

Figure 14:
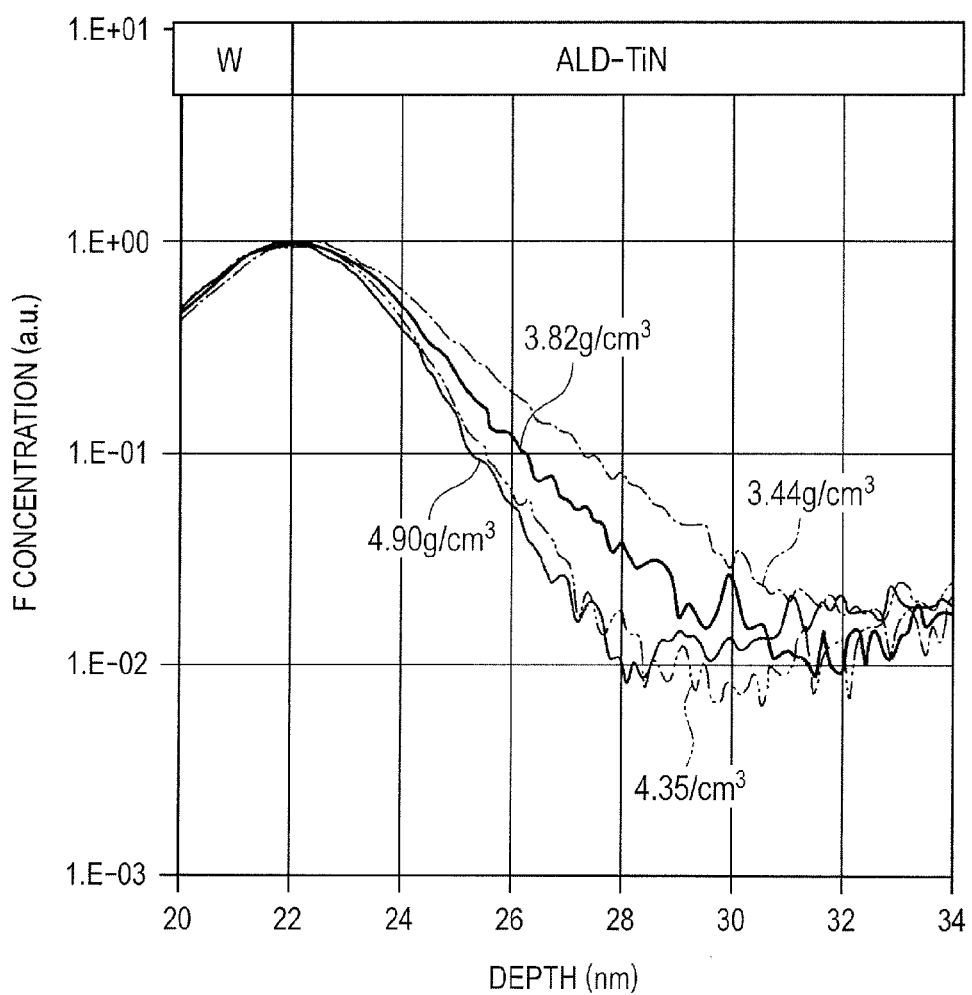
FIG. 14 is a graph showing a relationship between the depth of fluorine diffusing into each bather film species and the concentration of fluorine therein.

FIG. 14 is a graph showing a relationship between the depth (or moving distance) of fluorine diffusing into each of second electrodes EU2 (barrier film) species and the concentration of fluorine therein. The data were obtained by measurements according to backside secondary ion mass spectrometry (SIMS). FIG. 14 specifically shows a relationship between the depth and concentration of fluorine (F) about the species that are four bather film species different from each other in film density. As is evident from this graph, as the density of the film is larger, the film can block the invasion of fluorine (F) in the range of a shorter distance. The used barrier film was a titanium nitride (TiN) film having a film thickness of about 3 nm.

Herein, the description has been made, using, as the bather film, a film in which the concentration of fluorine (F) passing through the bather film was reduced by one digit. It is however unessential to reduce the fluorine (F) concentration by one digit.

As has been described with reference to FIG. 10, the front surface of the interlayer dielectric INS4 has been subjected to CMP treatment. When attention is paid to the DRAM region DR and the logic circuit region LGC, the respective interlayer-dielectric-INS3-front surfaces in the two regions are substantially equal in height to each other. When the step of forming the capacitive elements CON is next finished, only the DRAM region DR has the capacitive insulator film CINS and the upper electrode EU of the capacitive elements CON. Consequently, the height of the front surface of the interlayer dielectric INS4 subjected to the CMP treatment unfavorably becomes higher in the DRAM region DR than in the logic circuit region LGC, which is not illustrated. In other words, between the DRAM region DR and the logic circuit region LGC, a global step (level difference) is unfavorably generated to cause a problem of lowering the working precision in the step of making the contact holes CH3, in which the plug electrodes PLG3 are to be made, the step of forming the interconnection M2, and other steps. This problem is also caused at the time of working into plural interconnections to be formed over the interconnection M2.

The present embodiment makes it possible to cause the second upper electrode EU2 to have a function as a bather film to decrease the film thickness of the upper electrode EU. Thus, the embodiment has an advantageous effect that the global step can be decreased and the working precision can be improved.

Second Embodiment

Second embodiment corresponds to a modified example of the First embodiment.

In the present embodiment, the second upper electrode EU2 of the First embodiment in FIG. 9 is formed by a remote plasma nitriding method. Specifically, in the same way as in the First embodiment, the first upper electrode EU1 in FIG. 9, which is a nitride titanium (TiN) film, is formed by, for example, an MOCVD method. Thereafter, an already known remote plasma nitriding method is used to nitride the front surface of the titanium nitride film, which is the first upper electrode EU1, to form a second upper electrode EU2. The titanium nitride film of which the second upper electrode EU2 is made is larger in nitrogen concentration than the titanium nitride film of which the first upper electrode EU1 is made. Moreover, the titanium nitride film of which the second upper electrode EU2 is made is larger in film density than the titanium nitride film of which the first upper electrode EU1 is made.

The Second embodiment is identical with the First embodiment except this method for forming the second upper electrode EU2.

Accordingly, the second upper electrode EU2, which is higher in film density than the first upper electrode EU1, is interposed between the third upper electrode EU3, and the first upper electrode EU1 or the capacitive insulator film CINS, thereby producing an advantageous effect that the present embodiment makes it possible to prevent a leakage in the capacitive insulator film CINS which is caused by the diffusion of impurities from the third upper electrode EU3.

The above has specifically described an invention made by the inventors by way of the embodiments thereof. However, the present invention is not limited to the embodiments. Thus, of course, the embodiments can each be variously modified as far as the modified embodiment does not depart from the subject matter thereof.

What is claimed is:

1. A semiconductor integrated circuit device, comprising a plurality of DRAM cells each comprising a selective MISFET and a capacitive element that are coupled in series to each other,
    the device comprising:
    a semiconductor substrate,
    a first insulator film formed over a main surface of the semiconductor substrate, and having a capacitor-forming trench comprising a side wall and a bottom surface,
    a lower electrode formed along/over the side wall and the bottom surface comprised in the capacitor-forming trench,
    a capacitive insulator film formed over the lower electrode to cover the lower electrode,
    a first upper electrode formed over the capacitive insulator film to cover the capacitive insulator film,
    a second upper electrode formed over the first upper electrode to cover the first upper electrode,
    a third upper electrode formed over the second upper electrode to cover the second upper electrode, and having a smaller electric resistivity than the first upper electrode and being allowable to contain an impurity,
    wherein the capacitive element comprises the lower electrode, the capacitive insulator film, and an upper electrode comprising the first upper electrode, the second upper electrode and the third upper electrode, and
    wherein the second upper electrode is a bather layer for preventing the possible impurity contained in the third upper electrode from diffusing into the capacitive insulator film.

2. The semiconductor integrated circuit device according to claim 1,
    wherein the second upper electrode is larger in film density than the first upper electrode.

3. The semiconductor integrated circuit device according to claim 2,
    wherein the second upper electrode is smaller in film thickness than the first upper electrode.

4. The semiconductor integrated circuit device according to claim 1,
    wherein the second upper electrode is a film having no opening.

5. The semiconductor integrated circuit device according to claim 1,
    wherein the third upper electrode comprises a tungsten film.

6. The semiconductor integrated circuit device according to claim 5,
    wherein the third upper electrode is smaller in electric resistivity than the second upper electrode.

7. The semiconductor integrated circuit device according to claim 1,
    wherein inside the capacitor-forming trench, along/over the side wall and the bottom surface, the lower electrode, the capacitive insulator film, the first upper electrode, the second upper electrode, and the third upper electrode are arranged in this order.

8. The semiconductor integrated circuit device according to claim 1,
wherein the second upper electrode comprises a titanium nitride film having a predetermined density (X) and a predetermined film thickness (Y), and
wherein the titanium nitride film satisfies the following relational expression:

$Y \geq 16.1 e^{-0.36X}$.

9. The semiconductor integrated circuit device according to claim 1,
wherein the capacitive insulator film is one selected from the group comprising of a zirconium oxide film, a hafnium oxide film, and a tantalum oxide film.

10. The semiconductor integrated circuit device according to claim 9,
wherein the lower electrode is one selected from the group comprising of a titanium nitride film, a titanium film, and a tungsten film.

11. The semiconductor integrated circuit device according to claim 9,
wherein the first upper electrode comprises at least one selected from the group comprising of titanium nitride, titanium, platinum, iridium, and ruthenium.

12. A method for producing a semiconductor integrated circuit device, comprising the steps of:
(a) forming a first insulator film having a capacitor-forming trench comprising a side wall and a bottom surface over a main surface of a semiconductor substrate;
(b) forming a lower electrode along/over the side wall and the bottom surface of the capacitor-forming trench;
(c) forming a capacitive insulator film over the lower electrode to cover the lower electrode;
(d) forming a first upper electrode over the capacitive insulator film to cover the capacitive insulator film;
(e) forming a second upper electrode over the first upper electrode to cover the first upper electrode; and
(f) forming a third upper electrode that may contain an impurity over the second upper electrode to cover the second upper electrode;
the semiconductor integrated circuit device comprising a capacitive element, the capacitive element comprising the lower electrode, the capacitive insulator film, the first upper electrode, the second upper electrode, and the third upper electrode, and
the second upper electrode being a barrier film for preventing the possible impurity contained in the third upper electrode from diffusing into the capacitive insulator film.

13. The method for producing a semiconductor integrated circuit device according to claim 12,
wherein the second upper electrode is larger in film density than the first upper electrode.

14. The method for producing a semiconductor integrated circuit device according to claim 13,
wherein the second upper electrode is formed by one selected from the group comprising of an ALD method, an MOCVD method, and a PVD method.

15. The method for producing a semiconductor integrated circuit device according to claim 13,
wherein the second upper electrode is formed by nitriding the front surface of the first upper electrode by a remote plasma nitriding method.

16. The method for producing a semiconductor integrated circuit device according to claim 12,
wherein the first upper electrode is formed by one selected from the group comprising of an MOCVD method and an ALD method.

17. The method for producing a semiconductor integrated circuit device according to claim 12,
wherein the capacitive insulator film is formed by one selected from the group comprising of an ALD method and a CVD method.

18. The method for producing a semiconductor integrated circuit device according to claim 12,
wherein the lower electrode is formed by one selected from the group comprising of an MOCVD method and an ALD method.

19. The method for producing a semiconductor integrated circuit device according to claim 12,
wherein the step of forming the third upper electrode comprises the steps of:
(g1) depositing a tungsten film over the second upper electrode to embed the capacitor-forming trench completely therewith, and
(g2) subjecting the front surface of the tungsten film to CMP treatment.

20. The method for producing a semiconductor integrated circuit device according to claim 19,
wherein the tungsten film is formed by a CVD method using $WF_6$ gas.

21. A semiconductor integrated circuit device, comprising a plurality of DRAM cells each comprising a selective MISFET and a capacitive element that are coupled in series to each other,
the device comprising:
a semiconductor substrate,
a first insulator film formed over a main surface of the semiconductor substrate, and having a capacitor-forming trench comprising a side wall and a bottom surface,
a lower electrode formed along/over the side wall and the bottom surface comprised in the capacitor-forming trench,
a capacitive insulator film formed over the lower electrode to cover the lower electrode,
a first upper electrode formed over the capacitive insulator film to cover the capacitive insulator film,
a second upper electrode formed over the first upper electrode to cover the first upper electrode,
a third upper electrode formed over the second upper electrode to cover the second upper electrode, and having a smaller electric resistivity than the first upper electrode, the third upper electrode comprising a tungsten film having fluorine impurities therein,
wherein the capacitive element comprises the lower electrode, the capacitive insulator film, and an upper electrode comprising the first upper electrode, the second upper electrode and the third upper electrode, and
wherein the second upper electrode is formed of a material capable of serving as a bather layer to prevent fluorine impurities contained in the third upper electrode from diffusing into the capacitive insulator film.

* * * * *